United States Patent [19]

Maeda et al.

[11] Patent Number: 5,079,183
[45] Date of Patent: Jan. 7, 1992

[54] C-MOS DEVICE AND A PROCESS FOR MANUFACTURING THE SAME

[75] Inventors: Satoshi Maeda, Yokohama; Hiroshi Iwai, Tokyo, both of Japan

[73] Assignee: Kabushiki Kaisha Toshiba, Kawasaki, Japan

[21] Appl. No.: 478,044

[22] Filed: Jan. 6, 1989

Related U.S. Application Data

[60] Division of Ser. No. 75,289, Jul. 20, 1987, abandoned, which is a continuation of Ser. No. 630,814, Jul. 13, 1984, abandoned.

[30] Foreign Application Priority Data

| Jul. 15, 1983 | [JP] | Japan | 58-128919 |
| Jul. 29, 1983 | [JP] | Japan | 58-138083 |
| Jul. 29, 1983 | [JP] | Japan | 58-138801 |
| Jul. 29, 1983 | [JP] | Japan | 58-138802 |
| Sep. 30, 1983 | [JP] | Japan | 58-180544 |
| Sep. 30, 1983 | [JP] | Japan | 58-182655 |

[51] Int. Cl.$^5$ .................. H01L 21/3205; H01L 21/76
[52] U.S. Cl. .................. 437/64; 437/89; 437/90
[58] Field of Search .................. 437/64, 89, 90

[56] References Cited

U.S. PATENT DOCUMENTS

| 3,861,968 | 1/1975 | Magdo et al. | 148/175 |
| 4,101,350 | 7/1978 | Possley et al. | 148/175 |
| 4,145,803 | 3/1979 | Tasch, Jr. | 29/571 |
| 4,319,395 | 3/1982 | Lund | 437/34 |
| 4,412,868 | 11/1983 | Brown et al. | 437/89 |
| 4,536,945 | 8/1985 | Gray et al. | 357/34 |
| 4,566,025 | 1/1986 | Jastrzedski et al. | 357/42 |
| 4,571,818 | 2/1986 | Robinson et al. | 357/49 |

FOREIGN PATENT DOCUMENTS

| 0084265 | 7/1983 | European Pat. Off. | |
| 0001225 | 1/1982 | Japan | 437/89 |
| 0068049 | 4/1982 | Japan | 437/89 |
| 0076830 | 5/1982 | Japan | 437/89 |
| 0093252 | 6/1983 | Japan | 437/89 |
| 0114419 | 7/1983 | Japan | 437/89 |
| 0114422 | 7/1983 | Japan | 437/89 |

OTHER PUBLICATIONS

European Patent Application No. 0084265.
IBM Technical Disclosure Bulletin, vol. 24, Dec. 1981, pp. 3684–3688.
IBM Tech. Bull., vol. 24, No. 7B, Dec. 1981–Hansen et al., pp. 3684–3688.

*Primary Examiner*—Olik Chaudhuri
*Assistant Examiner*—Owmazd Ojan
*Attorney, Agent, or Firm*—Finnegan, Henderson, Farabow, Garrett and Dunner

[57] ABSTRACT

Element separate regions consisting of insulation material are provided on a semiconductor substrate of a first conductivity type. Element regions which respectively consist of monocrystalline semiconductor layers of the first and second conductivity types are provided in at least two adjacent regions among a plurality of island substrate regions separated by the element separate regions. An impurity layer is provided in that portion between the substrate and at least one of the element regions.

7 Claims, 12 Drawing Sheets

(d)

(e)

F I G. 7
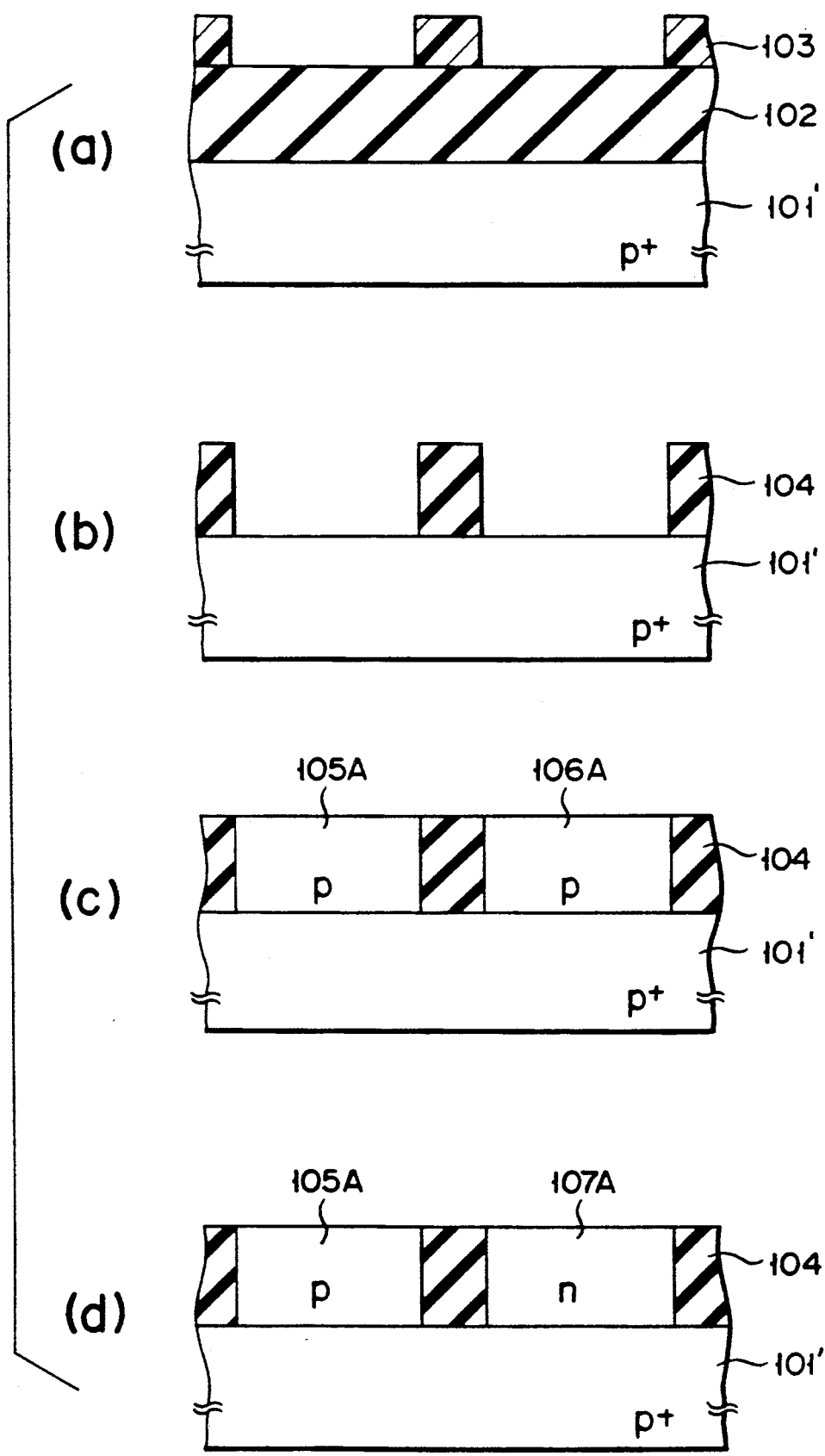

(e)

(f)

(g)

(h)

F I G. 11
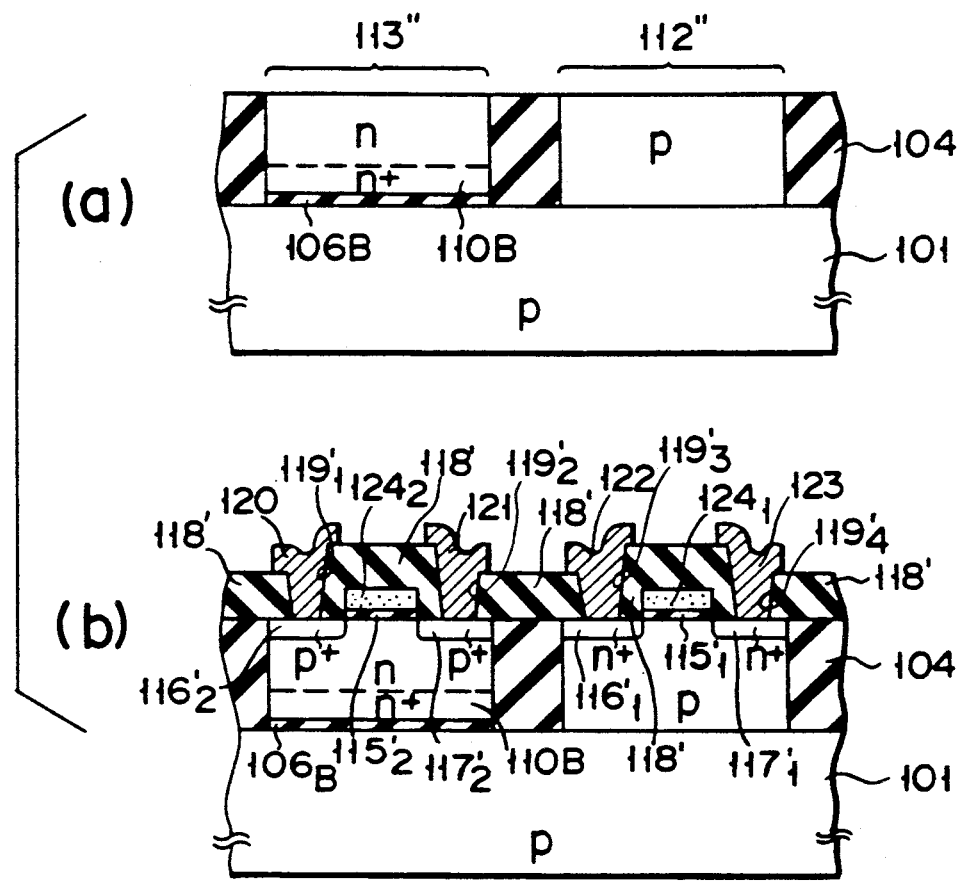
F I G. 12
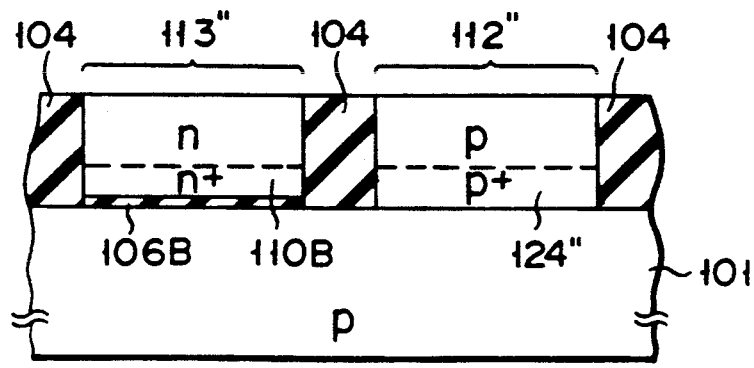

ns a polycrystalline silicon
C-MOS DEVICE AND A PROCESS FOR MANUFACTURING THE SAME This application is a division of application Ser. No. 075,289, filed July 20, 1987, which is a continuation of application Ser. No. 630,814, filed July 13, 1984, now abandoned.

BACKGROUND OF THE INVENTION

This invention relates to a C-MOS device and a process for manufacturing the same and, more particularly, to an improvement of the technology for forming the micropatterns thereon.

As is well known, in C-MOS (Complementary-Metal Oxide Semiconductor) devices, a pair of MOS transistors having p and n channels is formed on the same semiconductor substrate. Particularly, in recent C-MOS devices, the attainment of the technology for forming fine patterns thereon is demanded in association with high density and high integration.

The conventional C-MOS device is manufactured by the process which will be explained hereinbelow with reference to FIGS. 1(a) to 1(h).

As shown in FIG. 1(a), for example, a thermal oxide film 2 is grown on an n-type silicon substrate 1 having a surface index (100); and further, a resist pattern 3, a portion of which is removed by photoetching and which forms a well, is formed on the thermal oxide film 2. Thereafter, boron is ion-implanted using the resist pattern 3 as the mask under the conditions of, for instance, a dose amount of $8.5 \times 10^{12}$ cm$^{-2}$ at 100 keV, thereby forming a boron ion-implantation layer 4 in the substrate 1. Subsequently, as shown in FIG. 1(b), the resist pattern 3 is removed and the ion implantation layer 4 is thermally diffused, for instance, at 1200° C. for 30 hours to form a p-well region 5. Further, after removing the thermal oxide film 2 by etching, a thermal oxide film 6 and a silicone nitride film 7 are again sequentially formed. Then, as shown in FIG. 1(c), the field portions of the silicone nitride film 7 are selectively etched using the photoetching technique to form silicone nitride film patterns $7_a$ to $7_c$.

Next, as shown in FIG. 1(d), a resist pattern 8 which covers the regions other than the p-well region 5 is formed by photoetching. Then, after boron, for instance, is ion-implanted (under an acceleration voltage of 40 keV and a dose amount of $8 \times 10^{13}$ cm$^{-2}$ using the resist pattern 8 and silicone nitride film pattern $7_b$ as masks), it is thermally diffused to form a p$^-$ layer 9 which prevents field inversion. Subsequently, as shown in FIG. 1(e), the resist pattern 8 is removed, and a resist pattern 10 which covers the p-well region 5 is formed again by photoetching. After phosphorus, for instance, is ion-implanted under an acceleration voltage of 100 keV and a dose amount of $5 \times 10^{12}$ cm$^{-2}$ using the resist pattern 10 and silicone nitride film patterns $7_a$ and $7_c$ as masks, it is thermally diffused to form an n$^-$ layer 11 for the prevention of field inversion. Next, as shown in FIG. 1(f), the resist pattern 10 is removed; and the semiconductor device is selectively oxidized in a wet atmosphere at a high temperature using the silicone nitride film patterns $7_a$ to $7_c$ as the oxidation-resistant masks, thereby forming a field oxide film 12.

Subsequently, as shown in FIG. 1(g), thermal oxide films are grown in the island n-type silicon substrate 1 regions and p-well region 5 which are separated by a field oxide film 12. Further, a polycrystalline silicon film is deposited thereon and phosphorus is diffused in this polycrystalline silicon layer. Then, gate electrodes $13_1$ and $13_2$ are formed by patterning the polycrystalline silicon layer. After the thermal oxide films are etched using the gate electrodes as masks to form gate oxide films $14_1$ and $14_2$, boron is ion-implanted in the island substrate 1 region and arsenic is ion-implanted in the island p-well region 5, respectively, thereby forming p$^+$-type source and drain regions $15_1$ and $16_1$ and n$^+$-type source and drain regions $15_2$ and $16_2$. Thereafter, as shown in FIG. 1(h), a CVD-SiO$_2$ film 17 is deposited on the whole surface in accordance with the ordinary known manner and after contact holes $18_1$ to $18_4$ are formed therein, the Al film is deposited by evaporation in those respective holes $18_1$-$18_4$ and Al wirings 19 to 22 are formed by patterning, thereby manufacturing a C-MOS device.

However, the conventional C-MOS device manufactured in this way has the following drawbacks. Namely, the first problem is that an undesirable latch-up phenomenon is caused due to the occurrence of the parasitic pnp transistor which is constituted by the p$^+$-source region $15_1$ (or drain region $16_1$), n-type substrate 1 and p-well region 5, and due to the occurrence of the parasitic npn transistor which is constituted by an n$^+$-type source region $15_2$ (or drain region $16_2$), p-well region 5 and n-type substrate 1. Although this latch-up phenomenon depends upon the resistances of the substrate 1 and well region 5 and upon the carry-over probability of the minority carrier, the carry-over probability between them is determined by the distance between the n-channel and p-channel device regions. Therefore, as the patterns are formed more finely on the device, the latch-up phenomenon is caused more easily, so that the device's characteristics deteriorate. In addition, as shown in FIG. 1(b), the p-well region 5 has a tendency to extend in the direction of the depth of the substrate 1 and to also extend in the lateral direction (for example, when it extends by 10 μm in the direction of the substrate, it also extends by 7 to 8 μm in the lateral direction); therefore, this causes an obstacle which forms fine patterns and causes the deterioration of the degree of integration. Further, as shown in FIGS. 1(d) and 1(e), since ion implantation is performed to prevent field inversion of the n and p channels, the number of photoetching steps in manufacturing the device and the like increases, which has a negative effect in improving productivity. Further, with such a structure as mentioned above, the resistance ($\rho_s$) of the well portion is relatively high (typically, $\rho_s = 8$ kohms/□), so that when a substrate current flows due to the operation of the transistor formed on the well surface, the junction between the well and the region of the opposite conductivity type to the well which was formed on the well surface is biased in the forward direction due to the variation in the potential of the well. As a result, the latch-up phenomenon is caused as mentioned above. In addition, as shown in FIG. 1(b), since the device is subjected to thermal treatment at a high temperature (1200° C.) for a long time (30 hours) when the p-well region 5 is formed, warping occurs in the wafer as the diameter of the wafer becomes larger, making the photoetching step and the like difficult to perform. Also, a crystal defect and the like can occur, causing deterioration of the device.

On the other hand, the conventional C-MOS device manufactured in the manner as described above also has a problem of a soft error, which is caused by a α rays.

That is, in the case where the α rays enter the p-well 5 of the n-channel transistor section, the electrons produced in the well are absorbed by the n-type substrate 1 due to the potential difference at the pn junction, so that the soft error is suppressed. However, in the case where the α rays enter the substrate of the p-channel transistor section, since the pn junction, as the p-well, doesn't exist on the substrate side and as the structure to absorb the holes is not present, there is a drawback that the of holes produced are absorbed in the source $15_1$, drain $16_1$, gate $13_1$ of the p-channel transistor, and the like, so that it is difficult to suppress the soft error.

Further, as explained above, in the well structure, since the resistance of the portion of the p-well 5 is relatively high ($\rho_s = 8$ k$\Omega$/□), when the substrate current flows due to the operation of the transistor formed on the well surface, the potential in the p-well easily varies locally due to the voltage drop due to the substrate current. Thus, it is possible for the operation margin of the C-MOS device to decrease (in such a case, a malfunction could occur).

On one hand, the C-MOS device used as a circumference circuit and the like of the semiconductor memory device, and having the structure shown in FIG. 2 has been conventionally known. Namely, this device is manufactured in a similar manner as the process shown earlier. In the diagram, a reference numeral 21 denotes, e.g., an n-type silicon substrate and a p-well region 22 is selectively formed on the surface of this substrate 21. A field oxide film 23 is formed on the surface of the silicon substrate 21 which separates between the p-well region 22 and the region which will become a p-channel transistor. In addition, an n⁻-type inversion preventing layer 24 is formed on the surface of the boundary of the n-type silicon substrate 21 which is in contact with the field oxide film 23. Also, a p⁻-type inversion preventing layer 25 is formed on the surface of the boundary of the p-well region 22 which is in contact with the oxide film 23. A p⁺-type source region $26_1$ and a p⁺-type drain region $27_1$ which are mutually electrically insulated are formed on the surface of the island substrate 21 region separated by the field oxide film 23. Further, a gate electrode $29_1$ is provided through a gate oxide film $28_1$ on the substrate 21 which includes at least the channel region between those regions $26_1$ and $27_1$. A p-channel MOS transistor is constituted by the source and drain regions $26_1$ and $27_1$; gate electrode $29_1$; etc. Also, an n⁺-type source region $26_2$ and an n⁺-type drain region $27_2$ which are mutually electrically insulated are formed on the surface of the p-well region 22. Moreover, a gate electrode $29_2$ is provided through a gate oxide film $28_2$ on the p-well region 22 which includes at least the channel region between those regions $26_2$ and $27_2$. An n-channel MOS transistor is formed by the source and drain regions $26_2$ and $27_2$; gate electrode $29_2$; etc. Also, the p⁺-type source region $26_1$ is connected to a power supply terminal $V_{DD}$; the n⁺-type source region $26_2$ is connected to a ground terminal $V_{SS}$; the respective gate electrodes $29_1$ and $29_2$ are connected to an input terminal $V_{in}$; and the respective drain regions $27_1$ and $27_2$ are connected to an output terminal $V_{out}$, respectively.

However, in the above-described C-MOS device as shown in FIG. 2, the diffusion layers of the different conductivity types such as the well region 22; source and drain regions $26_1$, $26_2$, $27_1$, and $27_2$; etc. are provided on the silicon substrate 21. Therefore, it seems as if the bipolar transistors of the npn and pnp types were formed and mutually combined so that an undesirable parasitic thyristor having the pnpn structure could be formed. In reality, however, a vertical npn transistor 30 is parasitically formed in which the n-type silicon substrate 21 is used as the collector, the p-well region 22 is used as the base, and the n⁺-type source region $26_2$ (or n⁺-type drain region $27_2$) is used as the emitter. Since this parasitic transistor 30 uses, as the base, the p-well region 22 (f = 10 $\Omega$-cm; $x_j$ = 10 μm) with a low density which is peculiar to the C-MOS device, it easily has a large current amplification factor ($h_{FE} \approx 200$). This factor is responsible for producing the parasitic thyristor which easily causes the latch-up and soft errors as mentioned above due to noise from the outside. Thus, this causes malfunctions to occur which lead to the destruction of the C-MOS device.

Therefore, many problems can arise if such a C-MOS device as shown in FIG. 2 is used as the circumference circuit of a semiconductor memory device, e.g., of a dynamic RAM.

SUMMARY OF THE INVENTION

It is, therefore, an object of the present invention to provide a new and improved C-MOS device and a process for manufacturing the same in which the latch-up phenomenon is suppressed and the formation of fine patterns of the device is accomplished, in which high performance, high reliability and a high degree of integration of the C-MOS device are realized, and in which such a C-MOS device can be manufactured by a simple process.

It is another object of the present invention to provide a new and improved C-MOS device and a process for manufacturing the device in which latch-up is prevented, in which the soft error is suppressed, in which the formation of micropatterns of the device is accomplished, in which high performance, high reliability, and a high degree of integration of the C-MOS device are realized, and in which such a C-MOS device can be manufactured by a simple process.

It is yet another object of the present invention to provide a new and improved C-MOS device and a process for manufacturing the same in which in addition to prevention of latch-up, the operation margin is improved and the formation of fine patterns of the device is attained, in which high performance, high reliability, and a high degree of integration of the C-MOS device are realized, and in which such a C-MOS device can be manufactured by a simple process.

It is a further object of the present invention to provide a new and improved semiconductor memory device using a C-MOS transistor as the circumference circuit in which the prevention of the latch-up phenomenon and suppression of the soft error are accomplished, and in which high performance and high reliability of such a device can be realized.

According to the present invention, element separate regions consisting of insulative material are formed on a semiconductor substrate of a first conductivity type. Element regions consisting of monocrystalline semiconductor layers having first and second conductivity are provided in at least two adjacent regions among a plurality of island substrate regions separated by the element separate regions, respectively. An impurity layer is provided in the corresponding region between the substrate and at least one element region among the element regions.

According to the above structure, it is possible to provide a C-MOS device with high performance, high reliability, and a high degree of integration in which the suppression of the latch-up phenomenon and the suppression of the formation of the fine patterns of the device are accomplished, and which provides a process which can manufacture such a C-MOS device by a simple process.

In addition, in such a structure, by further providing an insulation layer in at least that portion of the boundary surface between the substrate and the one device region, it is possible to provide a C-MOS device in which, in addition to the above effects, the suppression of the soft error and an improvement in the operation margin can be attained, and to provide a process which can manufacture such a C-MOS device by a simple process.

Further, in the above-mentioned structure, at least one element region is in direct contact with the substrate constitutes a memory cell section. Because the C-MOS device having the insulation layer is used as the circumference circuit of this memory cell section, it is possible to provide a semiconductor memory device with high performance and high reliability in which preventing the latch-up phenomenon and suppressing the soft error are accomplished.

BRIEF DESCRIPTION OF THE DRAWINGS

The present invention can be understood by reference to the accompanying drawings, in which:

FIGS. 11(a) and (b) are cross-sectional views showing the C-MOS device according to the sixth embodiment of the present invention together with the process for manufacturing the device;

FIG. 12 is a cross-sectional view showing the base portion of the C-MOS device according to a modification of the sixth embodiment;

DETAILED DESCRIPTION OF THE PREFERRED EMBODIMENTS

First, the C-MOS device according to the first embodiment of the present invention will be described in accordance with the process for manufacturing the device shown in FIGS. 3(a)–(e).

Figure 3:
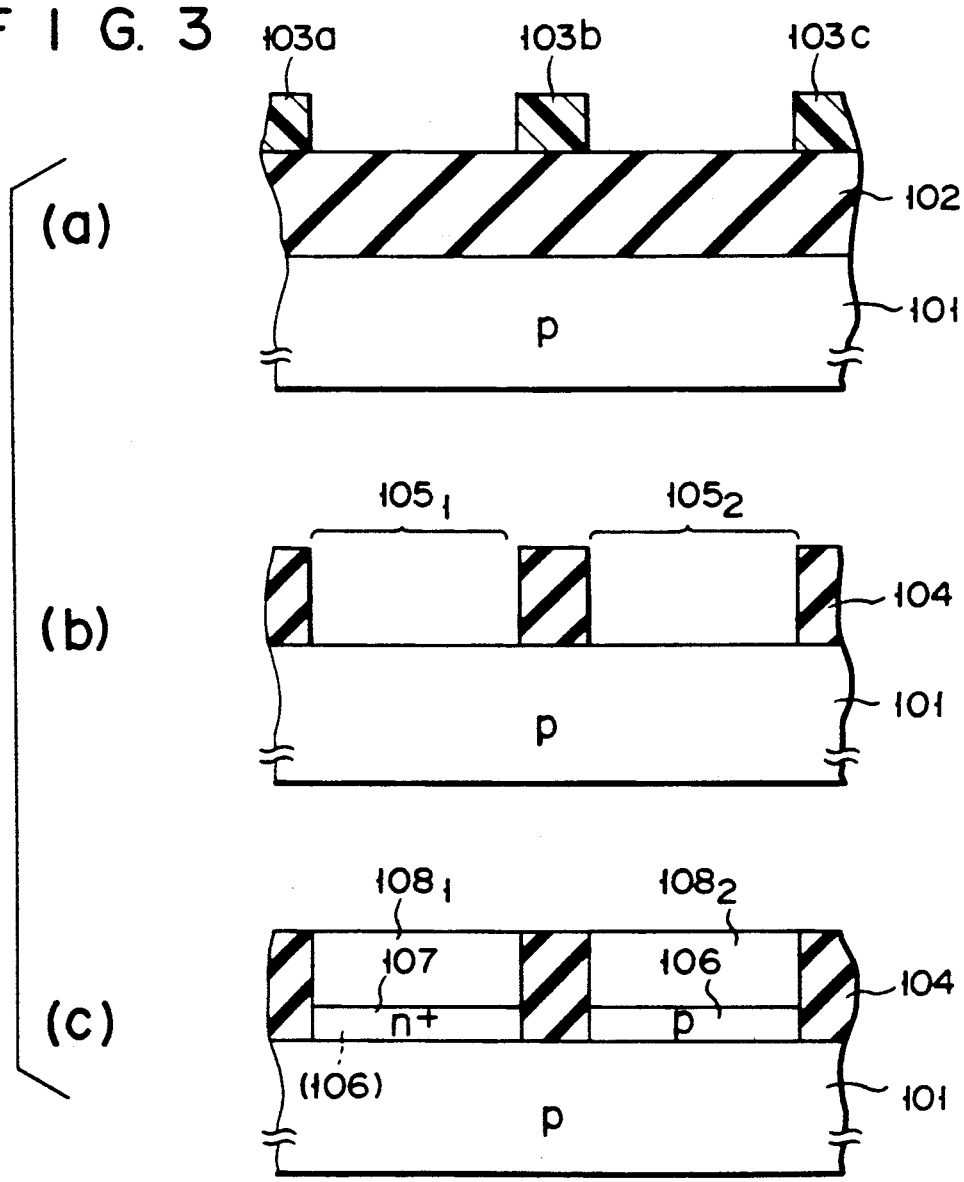
FIGS. 3(a)–(e) are cross-sectional views showing a C-MOS device according to the first embodiment of the present invention together with the process for manufacturing the device.
Figure 3:
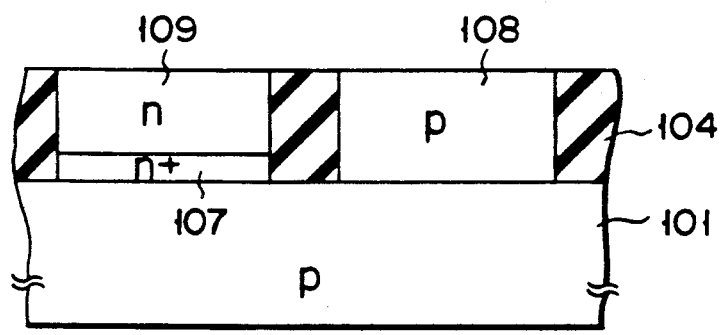
Figure 3:
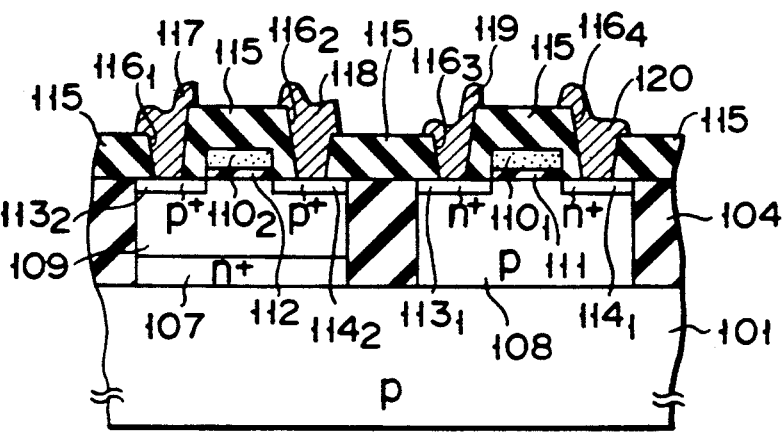

[i] First, an oxide film (insulation film) 102 having a thickness of 4 μm is grown by the CVD method on a p-type silicon substrate 101 of the surface index (100) as shown in FIG. 3(a). Subsequently, a photoresist film is coated on the whole surface thereof; and resist patterns (mask materials) $103_a$, $103_b$ and $103_c$ which cover the portions which will become element separate regions are formed by photoetching.

[ii] Then, the oxide film 102 is selectively etched by, e.g., reactive ion etching using the resist patterns $103_a$, $103_b$ and $103_c$ as the masks; and element separate regions 104 are formed as shown in FIG. 3(b). At this time, two adjacent island substrate regions $105_1$ and $105_2$ separated by the element separate regions 104 are formed.

[iii] Next, as shown in FIG. 3(c), thin monocrystalline silicon layers 106 each having a thickness of, e.g., 1 μm are deposited halfway at the bottom portions of the island substrate regions $105_1$ and $105_2$ by selective epitaxial growth. Subsequently, using a resist as a mask material (not shown), arsenic is added into only that portion of the thin monocrystalline silicon layer 106 on the island substrate region $105_1$ by, for example, ion implantation; this portion is converted to an n+-type monocrystalline silicon layer 107 having an impurity density of $1 \times 10^{17}/\text{cu}^3$ by photoetching. Next, monocrystalline silicon layers $108_1$ and $108_2$ each having a thickness of, e.g., 3 μm are again deposited in portions of the island substrate regions $105_1$ and $105_2$ by selective epitaxial growth so as to have the same thicknesses as the element separate regions 104.

[iv] Then, as shown in FIG. 3(d), for example, phosphorus is ion-implanted in the monocrystalline silicon layer $108_1$ where the n+ monocrystalline silicon layer 107 doesn't exist at the boundary surface between the substrate 101 and the layer $108_2$ using a resist pattern (not shown) as a mask under the conditions of the acceleration voltage of 200 keV and the dose amount of $5 \times 10^{11}/\text{cm}^2$. Thereafter, the device is subjected to heat treatment at, e.g., 1000° C. In this way, a p-type element region 108 consisting of the p-type silicon layer is formed in the monocrystalline silicon layer $108_2$. Also, an n-type element region (n-well) 109 consisting of the monocrystalline silicon layer converted to the n type is formed in the monocrystalline silicon layer $108_1$ where the n+-type monocrystalline silicon layer 107 exists.

[v] Subsequently, as shown in FIG. 3(e), the p-type and n-type element regions 108 and 109 are thermally oxidized to grow oxide films each having a thickness of 400 Å. Further, a phosphorus dope polycrystalline silicon film is deposited on the whole surface. After patterning this to selectively form gate electrodes $110_1$ and $110_2$ on the respective element regions 108 and 109, the oxide films are etched using these gate electrodes $110_1$ and $110_2$ as the masks, thereby forming gate oxide films 111 and 112. Then, arsenic is ion-implanted into the p-type element region 108; boron is ion-implanted into the n-type element region 109, respectively; and the device is thermally treated to form n+-type source and drain regions $113_1$ and $114_1$, and p+-type source and drain regions $113_2$ and $114_2$. Thereafter, a CVD-SiO$_2$ film 115 is deposited on the whole surface, and contact holes $116_1$ to $116_4$ are formed. Then, the Al film is deposited by evaporation and Al wirings 117 to 120 are formed by patterning, thereby manufacturing a C-MOS device.

As shown in FIGS. 3(a)–(e), the C-MOS device according to the first embodiment of the present invention as described above has the structure such that the element separate regions 104 are formed on the p-type silicon substrate 101; the p-type element region 108 and n-type element region (n-well) 109 each consisting of the monocrystalline silicon layer are provided in the island substrate regions $105_1$ and $105_2$ separated by the element separate regions 104. The n+-type monocrystalline silicon layer 107 having a density of $1 \times 10^{17}/cm^3$ is formed in the boundary surface of the substrate 101 of the n-type element region 109. Thus, the resistance ($\rho_s = 2K\Omega/\square$) of the n-well 109 can be decreased due to the n+-type monocrystalline silicon layer 107, and the potential variation in the well 109 can be suppressed, so that the latch-up phenomenon can be suppressed. In addition, since the n-well 109 is defined by the width between the element separate regions 104, and since the diffusion in the lateral direction caused by the conventional method (whereby a device is formed by doping an impurity) does not occur at all therefor, a C-MOS device with high density and a high degree of integration can be derived.

On the other hand, according to the manufacturing process of the first embodiment of the present invention, as shown in FIG. 3(d), the element regions 108 and 109 consisting of p-type and n-type monocrystalline silicon with substantially the same level as the surfaces of the element separate regions 104 can be formed in the island substrate regions separated by the element separate regions 104. Due to this, in the above-mentioned step, after the growth of the oxide films and the deposition of the phosphorus dope polycrystalline silicon film, it is possible to prevent the resist from remaining at the edge portions of the element separate regions 104 upon coating the resist film and upon photoetching. Thus, resist patterns can be formed with a good degree of dimensional accuracy. Also, the gate electrodes $110_1$ and $110_2$ can be accurately formed. Further, when the Al wirings are formed in this process, it is possible to prevent the respective Al wirings 117–120 from being cut at the edge portions of the element separate regions 104.

In addition, since a bird's beak (as in the selective oxidation method) is not caused in the step of forming the element separate regions 104, it is possible to suppress the formation of the fine element separate regions 104 and to suppress the reduction in the dimensions of the element regions 108 and 109, so that a C-MOS device with a high integration can be manufactured. Moreover, the production of white ribbons in the element regions 108 and 109 can be prevented, so that a C-MOS device with excellent characteristics can be derived. Further, upon formation of the n-well region (n-type element region), the device is not subjected to heat treatment at a high temperature for a long time, so that warping of the wafer and the occurrence of a crystal defect or the like can be prevented. In this way, a C-MOS device with excellent characteristics can be obtained.

Also, although oxide films have been used as insulation in the foregoing first embodiment, the insulation film is not limited to this; a CVD-SiO$_2$ film, Si$_3$N$_4$ film, Al$_2$O$_3$ film, etc., may be used.

Although the monocrystalline silicon layer was formed by selective epitaxial growth in the first embodiment, forming is not limited to this method. For instance, it is also possible to deposit a non-monocrystalline silicon layer (polycrystalline silicon layer) over the entire surface which may thereafter be replaced by a monocrystalline silicon layer using a laser beam or the like.

Although ion implantation has been adopted as a means for changing the p-type monocrystalline silicon layer to the n+-type or n-type layer used in the first embodiment, it is not limited to this method. A method whereby a PSG film or AsSG film is used as a diffusion source, a phosphorus diffusion method, or the like may be adopted.

Figure 4A:
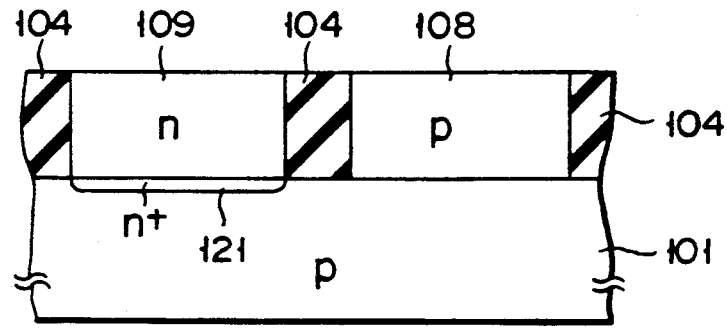
FIGS. 4A and 4B are cross-sectional views showing the base portions of the C-MOS devices according to modifications of the first embodiment.

In the first embodiment, as a means for forming the n+-type layer on the substrate boundary surface of the n-type element region, a method has been adopted whereby a thin monocrystalline silicon layer which is sufficiently thinner than the element separate regions is formed by selective epitaxial growth in which ions are implanted therein, but the means of forming the n+-type layer is not limited to this. For example, as shown in FIG. 4A, an n+ layer 121 is preliminarily formed in the island element region $105_1$ prior to selective epitaxial growth; thereafter selective epitaxial growth is performed; and the p-type element region 108 and n-type element region 109 may be formed. According to such a method, there is an advantage such that the p-type and n-type element regions 108 and 109 can be formed due to selective epitaxial growth at the same time.

Figure 4B:
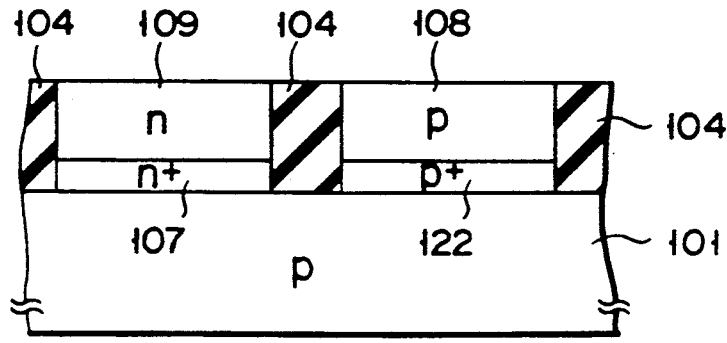

Although the n+-type monocrystalline silicon layer has been formed on only the substrate boundary surface of the n-type element region in the first embodiment, a p+-type monocrystalline silicon layer 122 may be also formed on the boundary surface of the substrate 101 of the p-type element region 108 as shown in FIG. 4B. With such a structure, the field inversion preventing layer can be omitted, so that the C-MOS devices can be mass-produced simply and in large amounts.

The foregoing first embodiment is not limited to the C-MOS/bulk in which a C-MOS device is produced on the semiconductor substrate; it can also be similarly applied to the C-MOS/SOS wherein a C-MOS device is produced on the SOS (silicon on sapphire).

As described in detail above, according to the first embodiment of the present invention, it is possible to provide a complementary-type of MOS semiconductor device with high performance, high reliability and a high degree of integration in which the prevention of the latch-up phenomenon and the prevention of the formation of fine patterns in the device are accomplished, and which provides a process for manufacturing such a C-MOS device by a simple process.

Next, the second embodiment of the present invention will be described with reference to FIGS. 5(a) and (b). However, in this second embodiment, as the process up until step (iii) of forming the monocrystalline silicon layers $108_3$ and $108_4$ is substantially similar to that of $108_1$ and $108_2$ in the foregoing first embodiment, the first three steps will be omitted and a description of the following steps will be made here.

Figure 5:
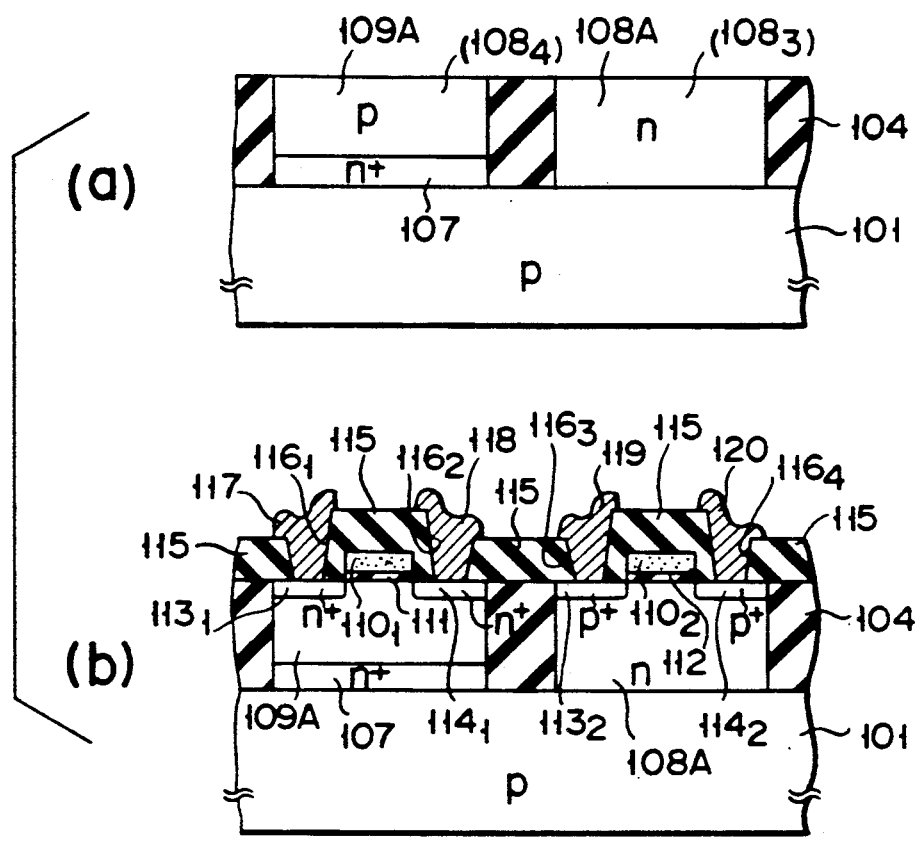
FIGS. 5(a) and (b) are cross-sectional views showing the C-MOS device according to the second embodiment of the present invention together with the process for manufacturing the device.

[iv'] That is to say, as shown in FIG. 5(a), a resist pattern (not shown) is used as a mask material; phosphorus, for instance, is ion-implanted into a monocrystalline silicon layer $108_3$ where the n$^+$-type monocrystalline silicon layer 107 doesn't exist on the boundary surface between the layer $108_3$ and the substrate 101, under the conditions of an acceleration voltage of 200 keV and a dose amount of $5\times10^{11}$/cm$^2$. At the same time, using a resist pattern (not shown) as a mask material, boron, for example, is ion-implanted into a monocrystalline silicon layer $108_4$ where the n$^+$-type monocrystalline silicon layer 107 exists on the boundary surface between the layer $108_4$ and the substrate 101, under the conditions of an acceleration voltage of 200 keV and a dose amount of $5\times10^{11}$/cm$^2$. Thereafter, the device is thermally treated at, e.g., 1100° C. Then a p-type element region $109_A$ consisting of a p-type silicon layer is formed in the latter layer ($108_4$), and an n-type element region $108_A$ consisting of an n-type silicon layer is formed in the former layer ($108_3$).

[v'] Subsequently, as shown in FIG. 5(b), the p-type and n-type element regions $109_A$ and $108_A$ are thermally oxidized to grow oxide films each having a thickness of 400 Å. Further, phosphorus dope polycrystalline silicon film is deposited on the whole surface. Then, the gate electrodes $110_1$ and $110_2$ on the respective element regions $109_A$ and $108_A$ are selectively formed by patterning the film. Thereafter, the oxide films are etched using the gate electrodes $110_1$ and $110_2$ as masks, thereby forming the gate oxide films 111 and 112. Then, arsenic is ion-implanted into the p-type element region $109_A$; and boron is ion-implanted into the n-type element region $108_A$, respectively. Then the regions are thermally treated to form the n$^+$-type source and drain regions $113_1$ and $114_1$, and to form the p$^+$-type source and drain regions $113_2$ and $114_2$. After that, the CVD-SiO$_2$ film 115 is deposited on the entire surface, and the contact holes $116_1$ to $116_4$ are formed. Then, Al film is deposited by evaporation and Al wirings 117 to 120 are formed by patterning, thereby manufacturing a C-MOS device.

As shown in FIG. 5(b), the C-MOS device according to the second embodiment of the present invention as described above has the structure such that: the element separate regions 104 are formed on the p-type silicon substrate 101; the p-type element region $109_A$ and n-type element region $108_A$ each consisting of the monocrystalline silicon layer are provided in the island substrate regions $105_1$ and $105_2$ separated by the element separate regions 104; and the n$^+$-type monocrystalline silicon layer 107 having a density of $10^{17}$/cm$^3$ of the opposite conductivity type to the p-type element region $109_A$ is formed on the boundary surface between the region $109_A$ and the substrate 101. Due to this, in the case where α rays enter the p-type element region $109_A$, the electrons produced in the p-type element region $109_A$ are absorbed into the n$^+$-type monocrystalline silicon layer 107 due to the potential difference at the pn junction since the n$^+$-type monocrystalline silicon layer 107 is provided on the boundary surface between the p-type element region $109_A$ and the substrate 101. On the other hand, when α rays enter the n-type element region $108_A$, the holes produced in the n-type element region $108_A$ are absorbed into the p-type substrate 101 due to the potential difference at the pn junction with the p-type silicon substrate 101. Thus, in both the p-channel and n-channel transistors, soft errors can be suppressed. In addition, the levels of the element separate regions 104, and the levels of the surfaces of the p-type and n-type element regions $109_A$ and $108_A$ become equal, permitting the entire surface to be made flat. Also, the n-type element region $108_A$ serving as the well is defined by the width between the element separate regions 104. Thus, it is possible to obstruct the diffusion in the lateral direction due to the implantation of ions and due to the diffusion processing as in the conventional process. Therefore, a C-MOS device with high density and high integration can be obtained.

As shown in FIG. 5(a), according to the process of manufacturing a C-MOS device in the second embodiment of the present invention, the element regions $109_A$ and $108_A$ which consist of p-type and n-type monocrystalline silicon, with substantially the same levels as the surfaces of the element separate regions 104, can be formed in the island substrate regions separated by the element separate regions 104. Due to this similarity to the foregoing first embodiment in the above-mentioned step, it is possible to prevent the resist from remaining at the edge portions of the element separate regions 104 upon the coating of the resist film and photoetching after the growth of the oxide films and the deposition of the phosphorus dope polycrystalline silicon film. Therefore, a resist pattern with good dimensional accuracy can be formed, and the gate electrodes $110_1$ and $110_2$ can be formed with accuracy. Also, when the Al wirings are formed in the above step, it is possible to prevent the Al wirings 117-120 from being cut at the edge portions of the element separate regions 104.

In addition, in the step of forming the element separate regions 104, the occurrence of the bird's beak as in the selective oxidation method is not caused as in the first embodiment, so that it is possible to suppress the formation of fine element separate regions 104 and to suppress the reduction in dimensions of the element regions $109_A$ and $108_A$; and a C-MOS device with high integration can be manufactured. Further, since the occurrence of the white ribbons in the element regions $109_A$ and $108_A$ can be prevented, a C-MOS device with excellent device characteristics can be derived.

Moreover, as in the first embodiment, since thermal treatment at a high temperature for a long time is not performed upon formation of the p-type and n-type element regions, warping of the wafer and the occurrence of a crystal defect and the like can be prevented, so that a C-MOS device with excellent characteristics can be derived.

On one hand, in the above second embodiment, oxide film was used as the insulation film as in the first embodiment, but it is not limited to this. For example, a CVD-SiO$_2$ film, Si$_3$N$_4$ film, Al$_2$O$_3$ film, and the like may be used.

Although the monocrystalline silicon layer was formed due to the selective epitaxial growth method in the second embodiment, it is not limited to this. For instance, after the non-monocrystalline silicon layer (polycrystalline silicon layer or the like) was deposited on the whole surface, it may be converted to a monocrystalline silicon layer by using an energy beam such as a laser beam or the like.

Figure 6A:
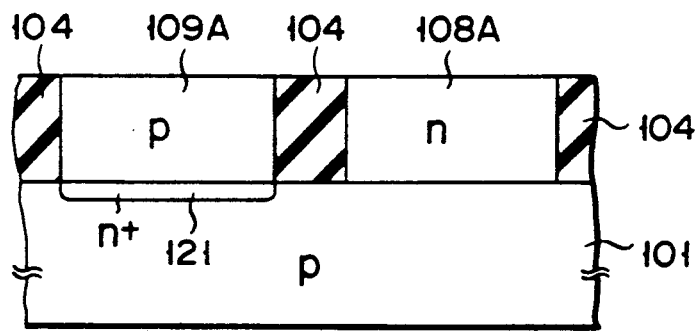
FIGS. 6A and 6B are cross-sectional views showing the base portions of the C-MOS devices according to modifications of the second embodiment.

In the second embodiment, as a means for forming the $n^+$-type monocrystalline silicon layer, a method has been adopted whereby the thin monocrystalline silicon layer which is thinner than the element separate regions is formed due to selective epitaxial growth and due to the ions implanted therein, but it is not limited to this. For example, as shown in FIG. 6A, after the n-type impurity is preliminarily ion-implanted into the island substrate region $105_1$ and after the doping is done by other means to form the $n^+$ layer 121, the p-type and n-type element regions $109_A$ and $108_A$ may be formed. According to such a method, there is an advantage such that the element region can be formed by selective epitaxial growth at the same time.

Figure 6B:
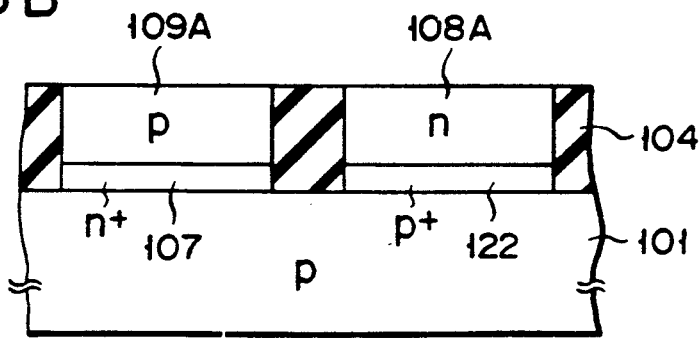

Although the $n^+$-type monocrystalline silicon layer 107 has been formed only on the boundary surface between the substrate 101 and the p-type element region $109_A$ in the second embodiment, it is not limited to this. For example, as shown in FIG. 6B, the $p^+$-type monocrystalline silicon layer 122 may be provided on the boundary surface between the substrate 101 and the n-type element region $108_A$. With such a structure, the field inversion preventing layer can be omitted and the C-MOS devices can be mass-produced simply and in great quantities.

Although the C-MOS/bulk whereby the C-MOS device is produced on the silicon substrate has been explained in the above second embodiment, the present invention can be also similarly applied to the C-MOS/SOS whereby the C-MOS device is produced on the silicon layer of SOS (Silicon On Sapphire).

As described above, according to the second embodiment of the present invention, it is possible to provide a C-MOS device with high performance, high reliability and a high degree of integration in which the suppression of the soft errors and the formation of micropatterns of the device are accomplished, and to provide a process for manufacturing such a semiconductor device by a simple process.

Next, the third embodiment of the present invention will be explained with reference to FIGS. 7(a)–(e).

Figure 7:
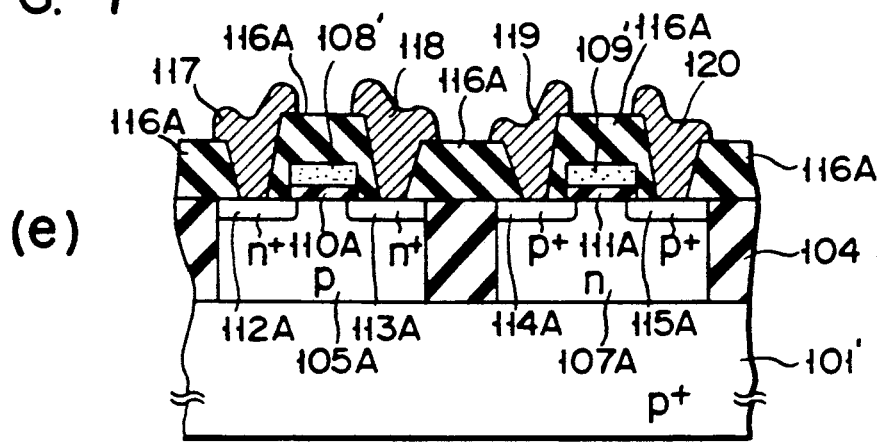
FIGS. 7(a)–(e) are cross-sectional views showing the C-MOS device according to the third embodiment of the present invention together with the process for manufacturing the device.

(i) Firstly, as shown in FIG. 7(a), the $SiO_2$ film (insulation film) 102 having a thickness of 3 μm is grown by the CVD method on a $p^+$-type silicon substrate 101' of a surface index (100) containing boron of, e.g., $10^{18}/cm^3$. Then, a photoresist film is coated and a resist pattern 103 is formed in the portion which will become the elemnt separate regions on the $SiO_2$ film 102 by photoetching. Subsequently, as shown in FIG. 7(b), by using the resist pattern 103 as a mask, the $SiO_2$ film 102 is selectively etched-removed by the reactive ion etching method (RIE method), thereby forming the element separate regions 104. After that, the resist pattern 103 was removed.

(ii) Next, as shown in FIG. 7(c), p-type monocrystalline silicon containing boron of $10^{15}/cm^3$ is deposited between the element separate regions 104 so as to have the same thickness as in the selective epitaxial growth method. Then, element regions $105_A$ and $106_A$ which consist of the p-type monocrystalline silicon of the same conductivity type as the substrate are formed in only that portion on the island silicon substrates 101' separated by the separate regions 104.

(iii) Next, as shown in FIG. 7(d), a portion of one of the element region $105_A$ is covered by a resist pattern (not shown). Then, the n-type impurity, e.g., phosphorus is ion-implanted into the other element region $106_A$ under the conditions of the acceleration voltage of 180 keV and the dose amount of $5 \times 10^{11}/cm^2$, thereby converting the element region $106_A$ to an n-type monocrystalline silicon (element region) $107_A$.

(iv) Then, as shown in FIG. 7(e), the element regions $105_A$ and $107_A$ consisting of the p-type and n-type monocrystalline silicon separated by the element separate regions 104 are thermally oxidized to grow the oxide films each having a thickness of 200 Å. Further, a phosphorus dope polycrystalline silicon film having a thickness of 3000 Å is deposited on the whole surface. Thereafter the polycrystalline silicon film is selectively etching-removed by the RIE method using a resist pattern (not shown) as a mask, thereby forming the gate electrodes 108' and 109'. Subsequently, the oxide films are etched using the gate electrodes 108' and 109' as masks to form gate oxide films $110_A$ and $111_A$. After that, using the gate electrodes $108_A$ and $109_A$ and element separate regions 104 as masks, arsenic and boron are respectively ion-implanted into the p-type element region $105_A$ and n-type element region $107_A$ in accordance with the ordinary manner. In this way, $n^+$-type source and drain regions $112_A$ and $113_A$ are formed in the element region $105_A$ consisting of p-type monocrystalline silicon, while $p^+$-type source and drain regions $114_A$ and $115_A$ are formed in the element region $107_A$ consisting of n-type monocrystalline silicon. Then, a $CVD$-$SiO_2$ film $116_A$ is deposited on the whole surface, and the contact holes are formed therein. After that, gate fetching Al wiring (not shown) and Al wirings 117–120 which fetches the source and drain is formed due to the evaporation deposition of the Al film and the patterning, thereby manufacturing a C-MOS device.

According to the third embodiment of the present invention as described above, it is possible to reduce the substrate current due to the low resistance by use of the $p^+$-type silicon substrate 101' containing boron $(1 \times 10^{18}/cm^3)$ having high density, so that a latch-up can be suppressed in association with this. In other words, a latch-up can be suppressed since the characteristics such as the current amplification factor $h_{FE}$ and the like are improved by reducing the resistance of the collector (substrate 101') of the parasitic pnp bipolar transistor which is constituted by the $p^+$-type source region $114_A$ (or drain region $115_A$), element region $107_A$ consisting of n-type monocrystalline silicon, and the substrate 101'. In addition, the channel stopper can be automatically formed under the element separate regions 104 by use of the $p^+$-type silicon substrate 101', thereby enabling the step of forming the channel stopper to be omitted. Further, since the element separate regions 104 and the element regions $105_A$ and $107_A$ are made flat, it is possible to prevent polycrystalline silicon film from remaining at the edge portions of the element separate regions 104 due to etching, to prevent the resist from remaining at the edge portions thereof; and to prevent Al from being cut. Moreover, since the occurrence of the bird's beak, as in the selective oxidation method, is not caused in the step of forming the element separate regions, the formation of the fine element separate regions 104 and the reduction in dimensions of the element regions $105_A$ and $107_A$ can be suppressed, so that a C-MOS device with high integration can be derived.

The fourth embodiment of the present invention will then be described with reference to FIGS. 8(a)-(c).

Figure 8:
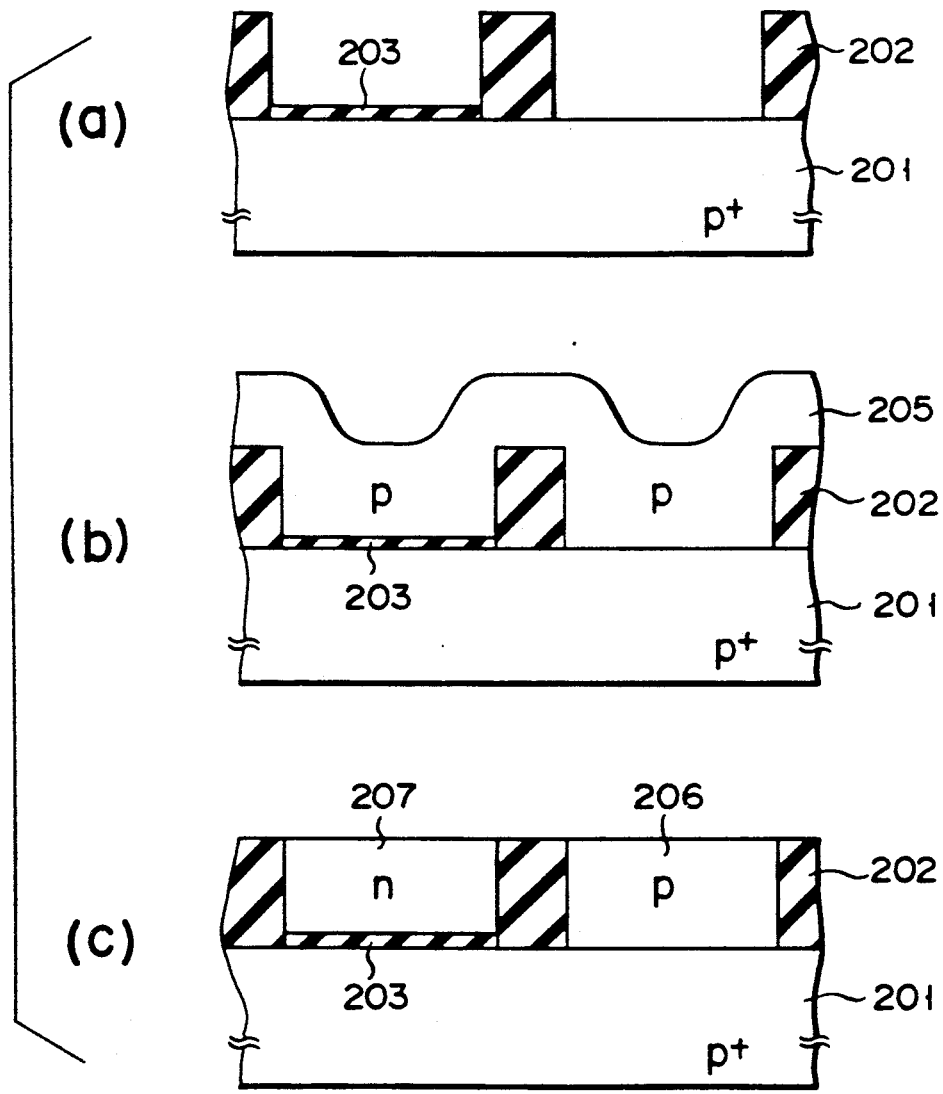
FIGS. 8(a)–(c) are cross-sectional views showing the C-MOS device according to the fourth embodiment of the present invention together with the process for manufacturing the device.

(i) First, as shown in FIG. 8(a), the element separate regions 202 are formed on a p+-type silicon substrate 201 containing boron of $10^{18}/cm^3$ by a similar method as in the foregoing third embodiment. Then oxide layers each having a thickness of 1000 Å are grown in the exposed silicon substrate regions. Thereafter, the oxide layer on one substrate region is removed, while the thin oxide layer 203 is allowed to remain in the other substrate region. Subsequently, as shown in FIG. 8(b), a polycrystalline silicon layer having the same thickness as the element separate regions 202 is deposited on the whole surface. Then a laser beam is radiated on the entire surface of the polycrystalline silicon layer to convert it to a monocrystalline layer, thereby forming a p-type monocrystalline silicon layer 205.

Next, as shown in FIG. 8(c), monocrystalline silicon on the element separate regions 202 is etched by use of the etchback process, allowing the p-type silicon layer to remain in only the substrate region. After that, the remaining p-type monocrystalline silicon layer where the oxide layer 203 doesn't exist at the lower portion is masked; and phosphorus is ion-implanted into the other p-type monocrystalline silicon layer where the oxide layer 203 exists at the lower portion under the conditions of the acceleration voltage of 200 KeV and a dose amount of $5 \times 10^{11}/cm^2$. In this way, a p-type element region 206 consisting of the p-type monocrystalline silicon layer is formed; while an n-type element region (n-well region) 207 consisting of monocrystalline silicon converted to an n type is formed. Subsequently, by a similar method as in the third embodiment, a C-MOS device (not shown) is manufactured.

According to the fourth embodiment of the present invention as described above, as shown in FIG. 8(c), the device has a structure such that the p-type element region (n-channel transistor region) 206 and the n-type element region (p-channel transistor region) 207 which were separated by the element separate regions 202 are provided, and that the thin oxide layer 203 is interposed on the whole boundary surface between the substrate 201 and the n-type element region 207. Due to this, no parasitic transistor is formed since the respective n-channel and p-channel transistors are isolated by the thin oxide layer 203. Thus, it is possible to derive a C-MOS device having good characteristics without the latch-up phenomenon due to the parasitic transistor.

In addition, although the p-type monocrystalline silicon layer serving as the element region has been grown so as to have the same thickness as the element separate regions in the foregoing third and fourth embodiments, it is not limited to this. As the above-described semiconductor substrate, for example, it is possible to mention the p+-type or n+-type semiconductor substrate or the substrate with the structure in which a monocrystalline simiconductor film was provided for such a substrate.

As described above, according to the foregoing third and fourth embodiments of the present invention, it is possible to provide a process which can manufacture a C-MOS device with high performance, high integration and high reliability in which latch-up is prevented, in which the formation of micropatterns on the device is realized, in which the variation in the substrate potential is suppressed, and the like.

The fifth embodiment of the present invention will then be explained with reference to FIGS. 9(a)-(j).

Figure 9:
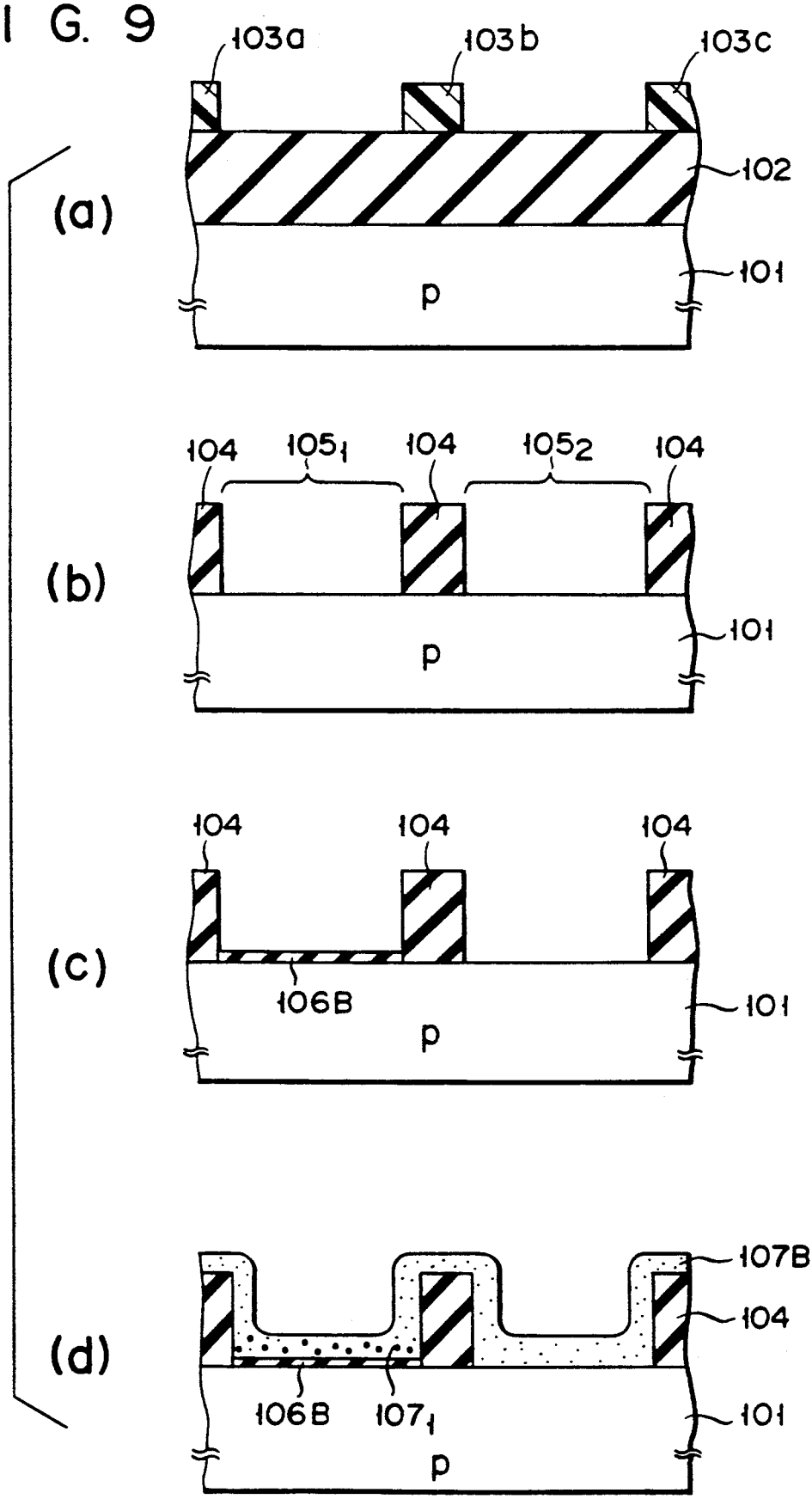
FIGS. 9(a)–(j) are cross-sectional views showing the C-MOS device according to the fifth embodiment of the present invention together with the process for manufacturing the device.
Figure 9:
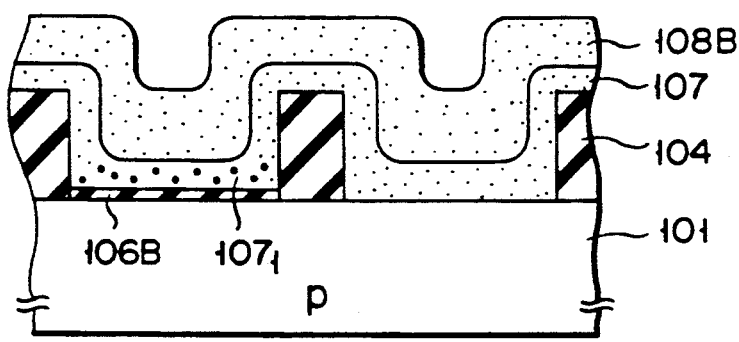
Figure 9:
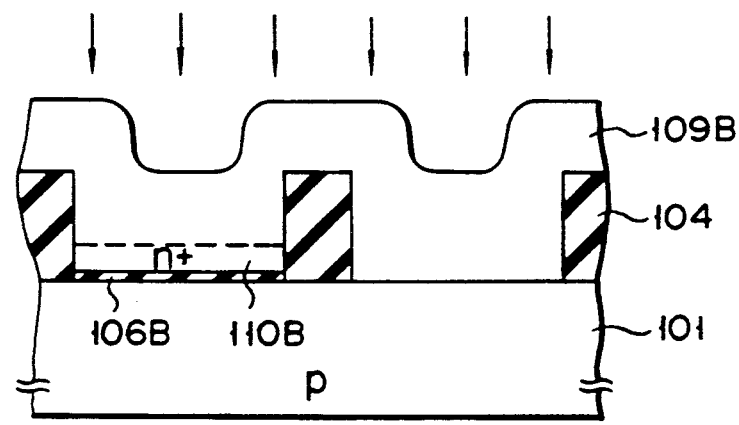
Figure 9:
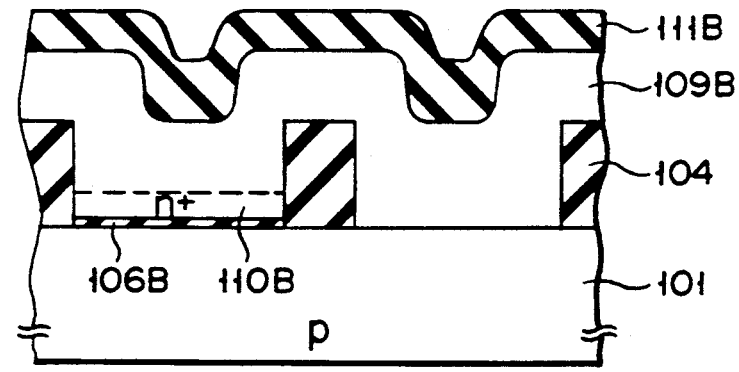
Figure 9:
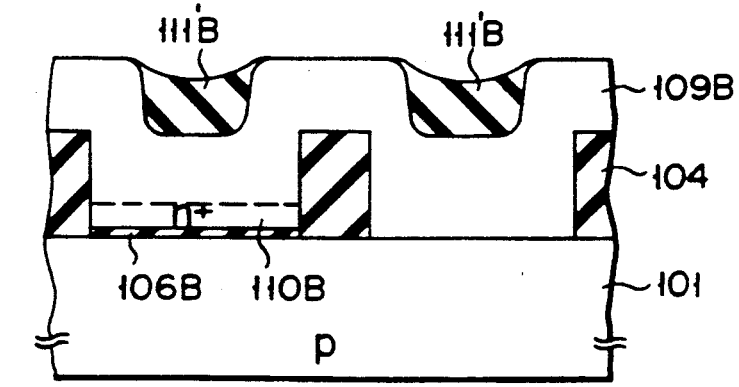
Figure 9:
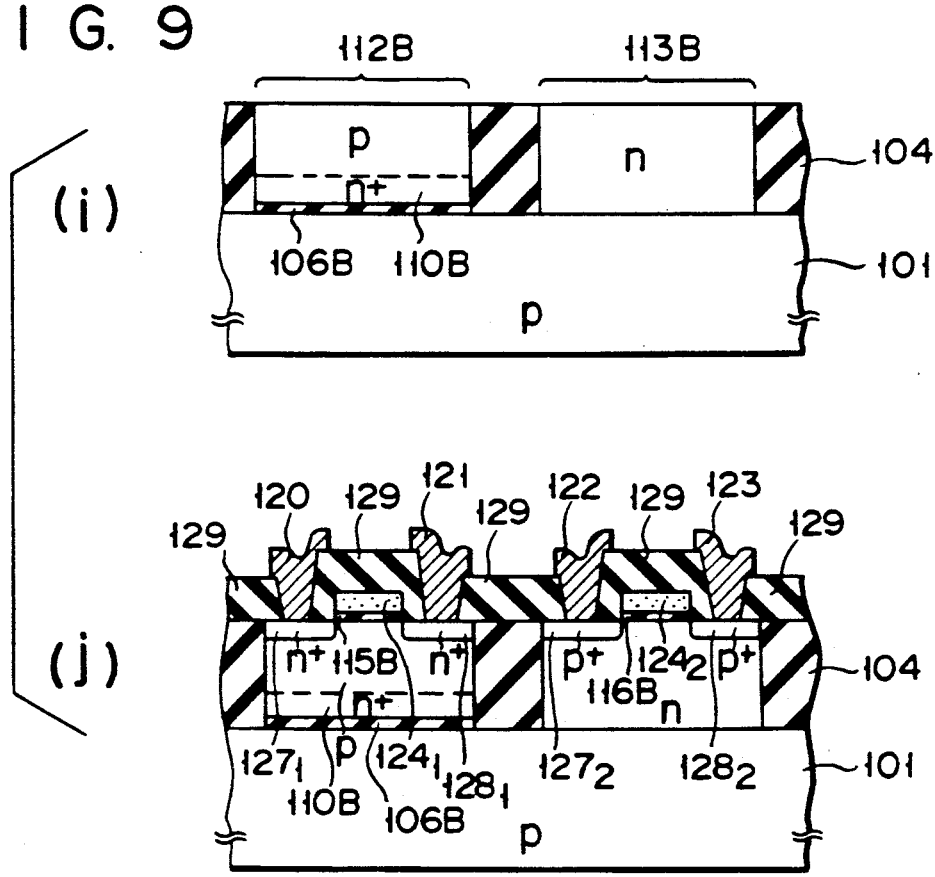

[i] First, as shown in FIG. 9(a), an oxide film (insulation film) 102 having a thickness of 4 μm is grown by the CVD method on the p-type silicon substrate 101 of a surface index (100). Then, a photoresist film is coated over the entire surface, and the resist patterns (mask materials) $103_a$, $103_b$ and $103_c$ covering the portions which will become the element separate regions are formed by photoetching. Subsequently, as shown in FIG. 9(b), using the resist patterns $103_a$, $103_b$ and $103_c$ as masks, the oxide film 102 is selectively etched by, e.g., reactive ion etching to form the element separate regions 104. Then the resist patterns $103_a$ to $103_c$ are removed. At this time, the two adjacent island substrate regions $105_1$ and $105_2$ separated by the element separate regions 104 are formed.

[ii] Next, as shown in FIG. 9(c), oxide layers each having a thickness of, e.g., 1000 Å are grown in the substrate regions $105_1$ and $105_2$ which are exposed due to the thermal oxidation treatment. Then, the oxide layer on the remaining substrate region $105_2$ is removed, and thereafter, a thin oxide layer $106_B$ is allowed to remain in the other substrate region $105_1$. Subsequently, as shown in FIG. 9(d), a thin non-monocrystalline silicon layer, e.g., a thin polycrystalline silicon layer $107_B$ having a thickness of 1 μm is deposited halfway on the whole surface. Then, using a resist as a mask material, for example, arsenic was added into only that portion of the polycrystalline silicon layer $107_B$ on the oxide layer $106_B$ by, e.g., ion implantation, thereby converting it to an n+-type polycrystalline silicon layer $107_1$ having an impurity density of $1 \times 10^{17}/cm^3$ due to photoetching.

[iii] Next, as shown in FIG. 9(e), a non-monocrystalline silicon layer, e.g., a polycrystalline silicon layer $108_B$ having a thickness of 3 μm is deposited again on the entire surface so as to have the same thickness as the element separate regions 104. Subsequently, as shown in FIG. 9(f), an energy beam, e.g., a laser beam is radiated on the whole surface of the polycrystalline silicon layer $108_B$. At this time, the side of the polycrystalline silicon layer, which is in direct contact with the p-type silicon substrate 101, is converted to a monocrystalline layer using the substrate 101 as the crystalline nucleus, thereby forming a p-type monocrystalline silicon layer $109_B$. At the same time, an n+-type monocrystalline silicon layer $110_B$ (n+ layer) is formed on the oxide layer $106_B$.

[iv] Next, as shown in FIG. 9(g), a plasma nitride film $111_B$ is deposited on the entire surface on the monocrystalline silicon layer $109_B$; this plasma nitride film $111_B$ is processed by reactive ion etching. At this time, as shown in FIG. 9(h), the etching rate of the plasma nitride film portion deposited on the concave portion of the monocrystalline silicon layer $109_B$ is slower than that of the other plasma nitride film portion on the flat monocrystalline silicon layer $109_B$, so that plasma nitride film $111'_B$ remains on only the concave portions of the monocrystalline silicon layer $109_B$. Subsequently, as shown in FIG. 9(i), the remaining plasma nitride film $111'_B$ and the monocrystalline silicon layer $109_B$ are simultaneously etched, thereby allowing the monocrystalline silicon layers to remain in only the island substrate regions $105_1$ and $105_2$ separated by the element separate regions 104. Thereafter, using a resist pattern (not shown) as a mask material, for example, phosphorus is ion-implanted into the monocrystalline silicon layer where the n+-type monocrystalline silicon layer $110_B$ doesn't exist at the lower portion under an acceleration voltage of 200 keV and a dose amount of $5\times10^{11}/cm^2$. On the other hand, using a resist pattern (not shown) as a mask material, for instance, phosphorus is ion-implanted into the monocrystalline silicon layer where the n+-type monocrystalline silicon layer $110_B$ exists at the lower portion under an acceleration voltage of 200 keV and a dose amount of $5\times10^{11}/cm^2$. Then, they are thermally treated at a temperature of, e.g., 1100° C. and a p-type element region $112_B$ consisting of the p-type silicon layer and an n-type element region $113_B$ consisting of an n-type silicon layer are formed.

[v] Subsequently, as shown in FIG. 9(j), oxide films each having a thickness of 400 Å are grown by thermally oxidizing the p-type and n-type element regions $112_B$ and $113_B$, and a phosphorus dope polycrystalline silicon film is further deposited on the entire surface. Then, gate electrodes $124_1$ and $124_2$ on the element respective regions $112_B$ and $113_B$ are selectively formed by patterning the surface. After that, the oxide films are etched using the gate electrodes $124_1$ and $124_2$ as masks; and gate oxide films $115_B$ and $116_B$ are formed. Then, arsenic is ion-implanted into the p-type element region $112_B$ and boron is ion-implanted into the n-type element region $113_B$, respectively. By thermal treatments, n+-type source and drain regions $127_1$ and $128_1$ and p+-type source and drain regions $127_2$ and $128_2$ are formed. Thereafter, a CVD-SiO$_2$ film 129 is deposited on the entire surface, and contact holes are formed therein. Then, due to the evaporation deposition of the Al film and the patterning, Al wirings 120 to 123 are formed, and a C-MOS device is thus manufactured.

In this way, a C-MOS device according to the fifth embodiment of the present invention as explained above has the structure such that: as shown in FIGS. 9(a)–(j), the element separate regions 104 are formed on the p-type silicon substrate 101; the p-type element region (n-channel transistor region) $112_B$ and n-type element region (p-channel transistor region) $113_B$, which respectively consist of the monocrystalline silicon layer, are provided in the island substrate regions $105_1$ and $105_2$ separated by the element separate regions 104; the thin oxide layer $106_B$ is interposed on the whole boundary surface between the substrate 101 and the p-type device region $112_B$; and the n+-type monocrystalline silicon layer $110_B$ is further provided on the boundary surface between the p-type device region $112_B$ and the oxide layer $106_B$. Due to this, since the n-channnal and p-channel transistors are insulated by the thin oxide layer $106_B$, no parasitic transistor is formed. Thus, it is possible to obtain a C-MOS device having good characteristics without the latch-up phenomenon due to a parasitic transistor. In addition, in the case where the α rays enter the p-type element region (p-well) $112_B$, electron-hole pairs are produced in the p-type device region $112_B$. These pairs are collected right under the source and drain regions $127_1$ and $128_1$, and gate electrode $124_1$ (which were all formed at the surface of the p-type element region $112_B$), which causes the malfunction of the MOS transistor, namely, a soft error. However, since the n+-type monocrystalline silicon layer $110_B$ is provided on the boundary surface between the p-type element region $112_B$ and the oxide layer $106_B$, the electrons are absorbed into the n+-type monocrystalline silicon layer $110_B$. Thus, a soft error can be suppressed since the ratio of absorption of the electrons into the source and drain regions $127_1$ and $128_1$ in the p-type element region $112_B$, and the like becomes small. On the other hand, since the bottom surface of the n-type element region $113_B$ is in contact with the p-type silicon substrate 101, the soft error can be similarly suppressed due to this substrate 101.

On the other hand, according to the manufacturing process of the fifth embodiment of the present invention, as shown in FIG. 9(i), the element regions $112_B$ and $113_B$ consisting of p-type and n-type monocrystalline silicon having substantially the same level as the surface of the element separate region can be formed in the island substrate regions separated by the element separate regions 104. Due to this, in the above-mentioned step, it is possible to prevent the resist from remaining at the edge portions of the element separate regions 104 upon the coating of the resist films and photoetching after the growth of the oxide films and after the deposition of the phosphorus dope polycrystalline silicon film. Thus, a resist pattern with a good dimensional accuracy can be formed, and thus gate electrodes $124_1$ and $124_2$ can be accurately formed. Also, when the Al wirings are formed in this step, it is possible to prevent the Al wirings 120–123 from being cut at the edge portions of the element separate regions 104.

Further, in the step of forming the element separate regions 104, since the occurrence of the bird's beak as in the selective oxidation method is not caused, the realization of the fine element separate regions 104 and the reduction in dimensions of the element regions $112_B$ and $113_B$ can be suppressed, so that a C-MOS device with a high degree of integration can be manufactured. In addition, since the occurrence of white ribbons in the element regions $112_B$ and $113_B$ can be prevented, a C-MOS device with excellent characteristics can be derived.

Further, the step of forming a field inversion preventing layer can be omitted by forming an oxide layer $106_B$ on the boundary surface between the p-type element region $112_B$ and the substrate 101. In addition, since the heat treatment at a high temperature for a long time is not performed upon formation of the p-type and n-type element regions, warping of the wafer and the crystal defect and the like can be prevented, so that a C-MOS devices can be mass-produced simply and in large amounts.

On one hand, although oxide film was used as the insulation film in the foregoing fifth embodiment, it is not limited to this. For instance, a CVD-SiO$_2$ film, Si$_3$N$_4$ film, Al$_2$O$_3$ film, etc. may be used.

Although polycrystalline silicon was used as the non-monocrystalline silicon in the above fifth embodiment, amorphous silicon may be used in place of this.

Although polycrystalline silicon was converted to monocrystalline silicon by use of a laser beam in the fifth embodiment, it may also be converted to monocrystalline silicon by an electron beam or an ion beam.

In the fifth embodiment, after the polycrystalline silicon layer was converted to a monocrystalline silicon layer by a laser beam, the etchback of the monocrystalline silicon layer on the element separate region was performed. However, it is also possible to preliminarily etchback the polycrystalline silicon layer on the element separate region to allow the polycrystalline silicon layer to remain in the island element region, which thereafter may be converted to a monocrystalline silicon layer by radiating a laser beam. Also, a resist film or a polyimide resin film may be used in place of the plasma nitride film in the etchback step.

Figure 10A:
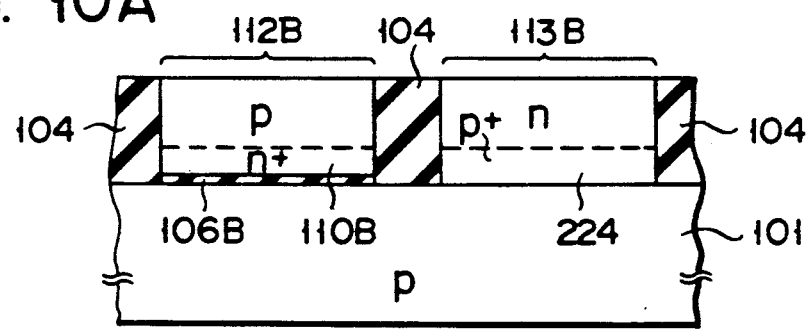
FIGS. 10A and 10B are cross-sectional views showing the base portions of the C-MOS devices according to modifications of the fifth embodiment.
Figure 10B:
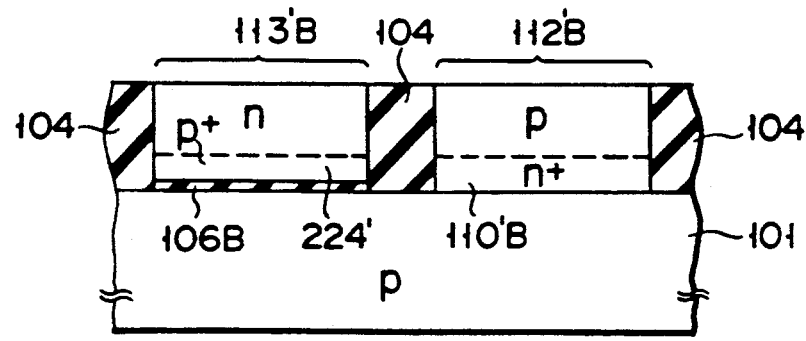

Although the n+-type monocrystalline silicon layer was provided at only the lower portion of the p-type element region in the fifth embodiment, as shown in FIG. 10A, a p+-type monocrystalline silicon layer 224 may be also provided on the boundary surface between the n-type element region $113_B$ and the p-type silicon substrate 101. Also, as shown in FIG. 10B, the device may be constructed in the manner such that: an n-type element region $113'_B$ is provided in the island substrate region where the thin oxide layer $106_B$ exists; a p+-type monocrystalline silicon layer 224' is formed on the boundary surface of the oxide layer $106_B$ of the n-type element region $113'_B$; a p-type element region $112'_B$ is further provided in the island substrate region where no oxide layer exits; and an n+-type monocrystalline silicon layer $110'_B$ is formed on the boundary surface between the p-type element region $112'_B$ and the p-type silicon substrate 101.

Although the oxide layer has been interposed on the entire boundary surface between the substrate and the one element region between the element regions formed in at least the two adjacent regions in the foregoing fifth embodiment, a thin insulation layer such as an oxide film or the like may be interposed on a portion of that boundary surface. In the case of partially interposing such an insulation layer in this way, it is desirable the arrange the insulation layer in the boundary portion near the other adjacent element region side.

Although a p-type silicon substrate was used in the fifth embodiment, an n-type silicon substrate or SOS (silicon on sapphire) may be used.

As described in detail above, according to the fifth embodiment of the present invention, it is possible to provide a C-MOS device with high performance, high reliability and high integration in which in addition to the prevention of the latch-up, soft errors are suppressed, and the formation of micropatterns of the device is realized, and which inturn provides a process which can mass-produce semiconductor devices simply.

Next, the sixth embodiment of the present invention will be described with reference to FIGS. 11(a) and (b). In this sixth embodiment, since the process up until step (iv) in which the plasma nitride film $111'_B$ (refer to FIG. 9(h)) is allowed to remain is similar to that in the fifth embodiment, only the steps subsequent to step (iv) will be explained here.

(iv') Namely, as shown in FIG. 11(a), after the step of allowing the plasma nitride films $111'_B$ to remain, the remaining plasma nitride films $111'_B$ and monocrystalline silicon layer $109_B$ are simultaneously etched, thereby allowing the p-type silicon layers to remain in only the island substrate regions $105_1$ and $105_2$ separated by the element separate regions 104. Thereafter, using a resist pattern (not shown) as a mask, for instance, phosphorus is ion-implanted into the p-type monocrystalline silicon layer where the oxide layer $106_B$ exists at the bottom portion under an acceleration voltage of 200 keV and a dose amount of $5 \times 10^{11}$ cm$^{-2}$. Then, it is thermally treated at, e.g., 1100° C.; and a p-type element region 112" (consisting of the p-type monocrystalline silicon layer) and an n-type element region (n-well) 113" (consisting of the monocrystalline silicon region converted to the n type) are formed.

(v') Next, as shown in FIG. 11(b), the p-type and n-type element regions 112" and 113" are thermally oxidized to growth oxide films each having a thickness of 400 Å. A phosphorus dope polycrystalline silicon film is further deposited on the entire surface and patterning, thereby selectively forming the gate electrodes $124_1$ and $124_2$ on the respective element regions 112" and 113". Thereafter, using those gate electrodes $124_1$ and $124_2$ as the masks, the oxide films are etched; and gate oxide films $115'_1$ and $115'_2$ are formed. Subsequently, arsenic is ion-implanted into the p-type element region 112" and boron is ion-implanted into the n-type element region 113", respectively. Then, they are thermally treated; and n+-type source and drain regions $116'_1$ and $117'_1$ and p+-type source and drain regions $116'_2$ and $117'_2$ are formed. After that, a CVD-SiO$_2$ film 118' is deposited on the entire surface and contact holes $119'_1$ to $119'_4$ are formed. Then, due to the evaporation deposition of the Al film and the patterning, Al wirings 120-123 are formed and a C-MOS device is manufactured.

In this way, the C-MOS device according to the sixth embodiment of the present invention as described above is constructed in the manner such that: as shown in FIGS. 11(a) and (b), the element separate regions 104 are provided on the p-type silicon substrate 101; the p-type element region (n-channel transistor region) 112" and n-type element region (p-channel transistor region) 113" which respectively consist of the monocrystalline silicon layer are provided in the island substrate regions $105_1$ and $105_2$ separated by those element separate regions 104; the thin oxide layer $106_B$ is interposed on the whole boundary surface between the substrate 101 and the n-type element region 113"; and the n+-type monocrystalline silicon layer $110_B$ is further provided on the boundary surface between the n-type element region 113" and the oxide layer $106_B$. Due to this, since the n-channel transistor and the p-channel transistor are insulated by the thin oxide layer $106_B$, no parasitic transistor is formed. Thus, it is possible to derive a C-MOS device having good characteristics without the latch-up phenomenon. In addition, since the surfaces of the p-type and n-type element regions 112" and 113" and the surfaces of the element separate regions 104 have the same level, those surfaces can be made flat. Further, since an n+-type monocrystalline silicon layer $110_B$ exists in the lower portion of the n-type element region 113" serving as the well, the resistance ($\rho_s = 2$ k$\Omega$/□) of the n-well 113" becomes small, so that it is possible to prevent the potential at the n-well 113" from locally varying due to a voltage drop because of the substrate current. Moreover, since the n-type element region 113" as the well is defined by the width between the element separate regions 104, the diffusion in the lateral direction is obstructed. Therefore, the above-mentioned latch-up phenomenon is prevented; the surfaces of the element regions are made flat; the variation in potential at the well region is prevented; and the diffusion in the lateral direction of the well region is prevented. Thus, it is possible to obtain a C-MOS device with high performance, high integration and high reliability.

On the other hand, according to the manufacturing process of the sixth embodiment of the present invention, as shown in FIGS. 11(a) and (b), the element regions 112" and 113" consisting of p-type and n-type monocrystalline silicon having substantially the same level as the surfaces of the element separate regions 104 can be formed in the island substrate regions separated by the element separate regions 104. Due to this, in the foregoing step [v'], it is possible to prevent the resist from remaining at the edge portions of the element separate regions 104 upon the coating of the resist film and photoetching after the growth of the oxide film and the deposition of the phosphorus dope polycrystalline silicon film. Thus, a resist pattern with a good dimensional accuracy can be formed; and the gate electrodes $124_1$ and $124_2$ can be accurately formed. Also, when Al wirings are formed in step [v'], it is possible to prevent the respective Al wirings 120-123 from being cut at the edge portions of the element separate regions 104.

Further, in the step of forming the element separate regions 104, the occurrence of the bird's beak as in the selective oxidation method is not caused, so that the realization of fine element separate regions 104 and the reduction in dimensions of the element regions 112" and 113" can be suppressed, and so that a C-MOS device with high integration can be manufactured. In addition, since it is possible to prevent the occurrence of white ribbons in the element regions 112" and 113", a C-MOS device with excellent characteristics can be derived.

Moreover, upon formation of the n-type element region 113" as the n-well, thermal treatment at a high temperature for a long time is not performed, so that warping of the wafer, and the occurrence of a crystal defect or the like can be prevented making possible a C-MOS device with excellent characteristics.

In addition, although oxide film has been used as the insulation film in the sixth embodiment, it is not limited to this. For instance, a $CVD\text{-}SiO_2$ film, $Si_3N_4$ film, $Al_2O_3$ film, etc. may also be used.

Although polycrystalline silicon has been used as non-monocrystalline silicon in the above sixth embodiment, it is also possible to use amorphous silicon or a monocrystalline silicon layer formed by epitaxial growth.

Although polycrystalline silicon has been converted to monocrystalline silicon by use of the laser beam in the sixth embodiment, it may also be converted to monocrystalline silicon by an electron beam or an ion beam.

Although the monocrystalline silicon layer on the element separate region has been etched after the polycrystalline silicon layer was converted to a monocrystalline silicon layer by the laser beam in the sixth embodiment, it is also possible to preliminarily etchback the polycrystalline silicon layer on the element separate region to allow the polycrystalline silicon layer to remain in the island element region. Thereafter the laser beam may be radiated thereon to convert it to a monocrystalline silicon layer. Also, in the etchback step, a resist film or a polyimide resin film may be used in place of the plasma nitride film.

Although ion implantation has been adopted as a means of converting the thin p-type polycrystalline silicon layer and p-type monocrystalline silicon layer to the $n^+$ type and n type a in the sixth embodiment, it is not limited to this. It is also possible to adopt a method whereby a PSG film or AsSG film is used as a diffusion source or a phosphorus diffusion method or the like.

Although the $n^+$-type monocrystalline silicon layer has been provided at only the lower portion of the n-type element region in the sixth embodiment, as shown in FIG. 12, a $p^+$-type monocrystalline silicon layer 124" may be also provided at the lower portion of the p-type element region 112". In such a case, boron may be used as an impurity source. With such a structure as shown in FIG. 12, $n^+$-type and $p^+$-type monocrystalline silicon layers (impurity layers) are formed in both element regions 112" and 113", so that the formation of the field inversion preventing layer can be omitted.

Although an oxide layer has been interposed on the entire boundary between the substrate and the one element region between the element regions formed between at least two adjacent regions in the sixth embodiment, a thin insulation layer such as an oxide layer or the like may be interposed in a portion of that boundary surface. In the case of partially interposing such an insulation layer in this way, it is desirable to arrange the insulation layer in the boundary portion to be near the other adjacent element region side.

Although the p-type silicon substrate has been used in the sixth embodiment, an n-type silicon substrate or SOS (silicon on sapphire) may also be used.

As described in detail above, according to the sixth embodiment of the present invention, it is possible to provide a C-MOS device with high performance, high reliability and high integration in which in addition to the prevention of the latch-up, the operation margin is improved, in which the formation of the micropatterns of the device is realized, and in which semiconductor devices can be mass produced simply.

Next, as the seventh embodiment, a semiconductor memory device using a C-MOS device as the circumference circuit will be explained.

Figure 1:
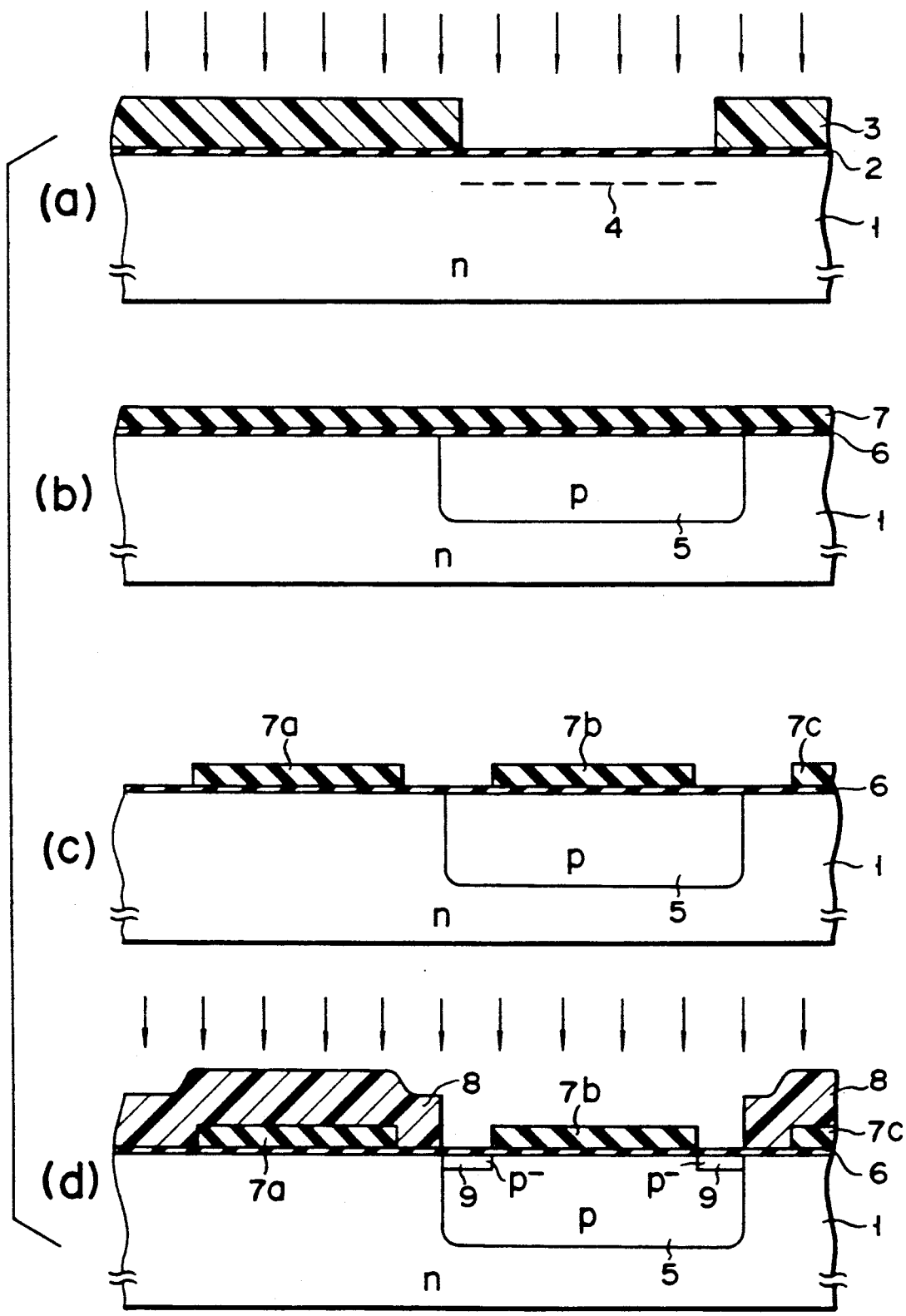
FIGS. 1(a)–(h) are cross-sectional views showing the conventional C-MOS device together with the process for manufacturing the device.
Figure 1:
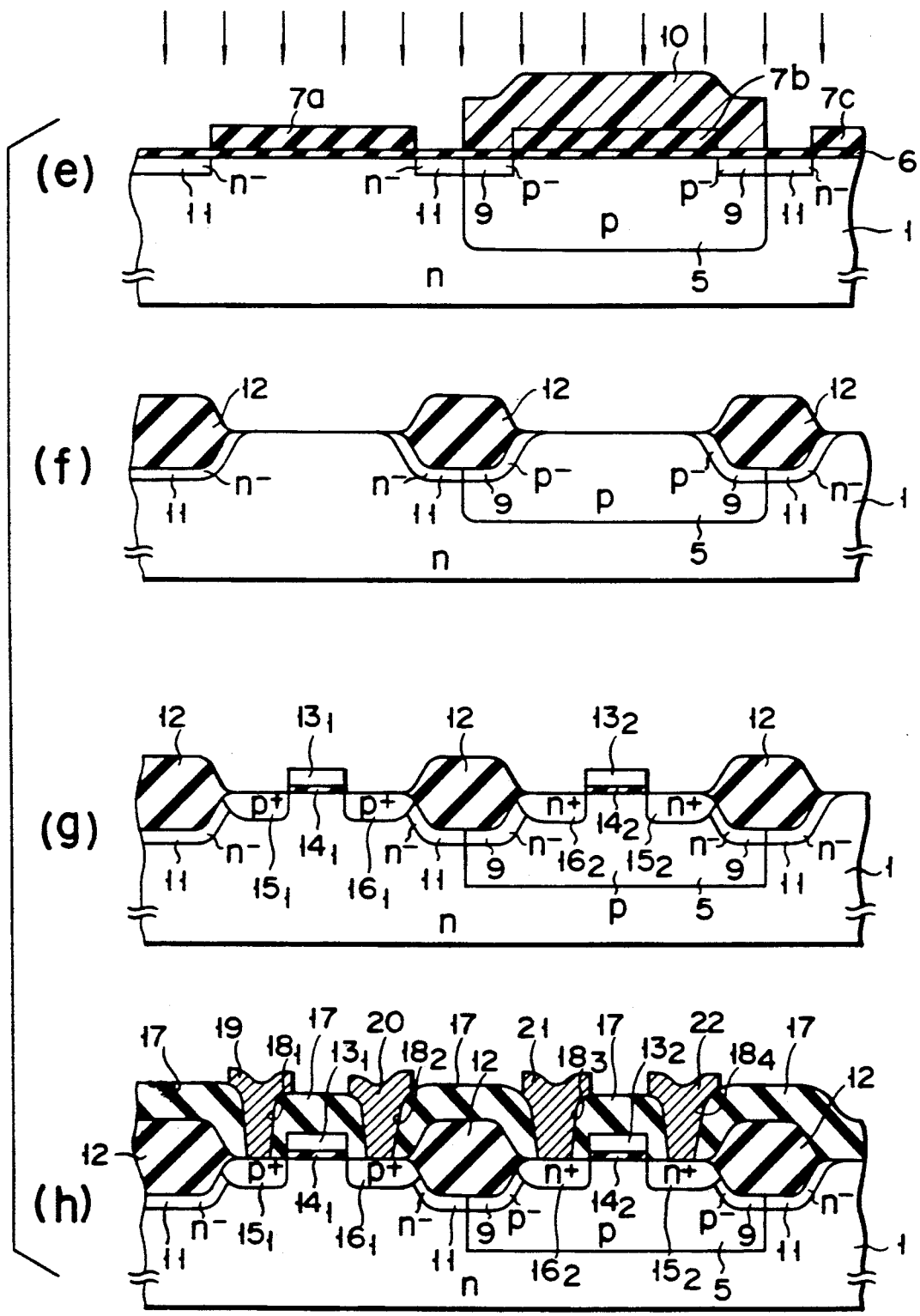
Figure 2:
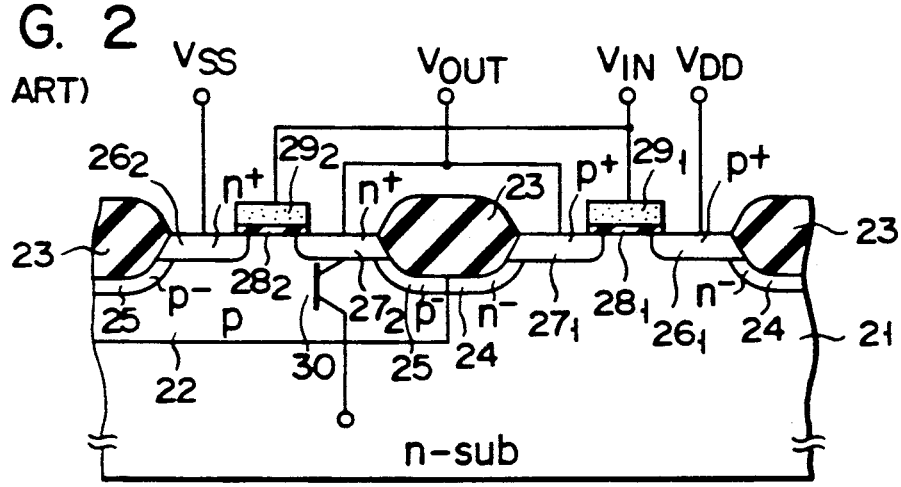
FIG. 2 is a cross-sectional view showing a C-MOS device which is used as a circumference circuit of the conventional memory device.

Namely, a C-MOS device of this kind, is required to solve the problems which the C-MOS device shown in FIG. 2 conventionally has. Therefore, the present inventors have already proposed a C-MOS device with the structure shown in FIG. 13. In other words, in FIG. 13, the element separate regions 32 consisting of, for example, $SiO_2$, are provided on an n-type silicon substrate 31. An n-type element region 33 consisting of an n-type monocrystalline silicon layer and a p-type element region 34 consisting of a p-type monocrystalline silicon layer are respectively embedded in the two island substrate regions separated by the element separate regions 32. In addition, thin oxide layers $35_1$ and $35_2$ are respectively interposed on the boundary surfaces among the element regions 33 and 34 and the substrate 31. $P^+$-type source and drain regions $36_1$ and $37_1$ which are mutually electrically isolated are provided on the surface of the n-type element region 33. Also, a gate electrode $39_1$ is provided through a gate oxide film $38_1$ on the n-type element region 33 which includes the channel region between those regions $36_1$ and $37_1$. A p-channel MOS transistor is constituted by the source and drain regions $36_1$ and $37_1$, gate electrode $39_1$, and the like. In addition, $n^+$-type source and drain regions $36_2$ and $37_2$ which are mutually electrically isolated are provided on the surface of the p-type element region 34. Also, a gate electrode $39_2$ is provided through a gate oxide film $38_2$ on the p-type element region 34 which includes the channel region between the source and drain regions $36_2$ and $37_2$. An n-channel MOS transistor is constituted by source and drain regions $36_2$ and $37_2$, gate electrode $39_2$, and the like. With such a structure, the thin oxide layers $35_1$ and $35_2$ are interposed on the boundary surfaces among the n-type and p-type element regions 33 and 34 and the substrate 31 by which constitute the p-channel and n-channel MOS transistors. Therefore, as described before, the formation of a parasitic bipolar transistor is obstructed. Thus, it is possible to obtain a C-MOS device having good characteristics without the latch-up phenomenon.

Figure 13:
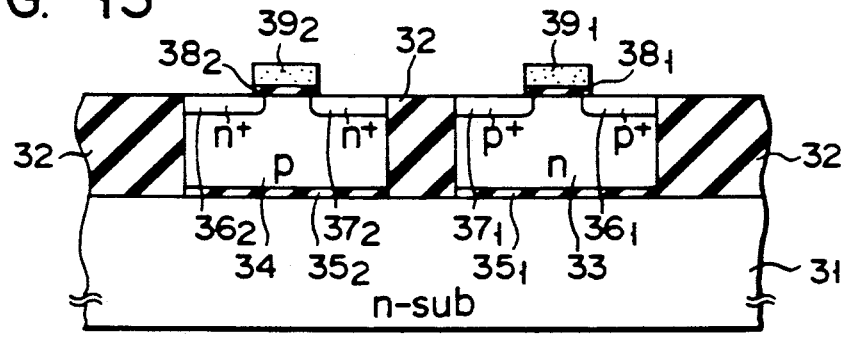
FIG. 13 is a cross-sectional view of the main part showing the C-MOS device according to the seventh embodiment of the present invention, in which the C-MOS device already proposed by the present inventors to explain a semiconductor memory device is used as the circumference circuit thereof.

However, if the above-described C-MOS device as shown in FIG. 13 is provided as is in the memory cell as the circumference circuit of the dynamic RAM, the following problems will occur. This can be explained with reference to FIG. 14. In the diagram, reference numeral 40 denotes a p-type element region consisting of a p-type monocrystalline silicon layer buried in the island substrate region adjacent to the p-type element region 34. A capacitor electrode 42 is provided through a thin oxide film 41 in most of the portion over the element region 40. An n⁻-type diffusion layer 43 is provided on the surface of the element region 40 under the capacitor electrode 42. Also, an n⁺-type diffusion layer 44 is provided on the surface of the p-type element region 40 which is separated by a desired distance from the diffusion layer 43. In the diagram, numeral 45 indicates a transfer gate electrode, portion of which is located on the surface of the element region 40 through a gate oxide film 46 formed between the n⁻-type diffusion layer 43 and the n⁺-type diffusion layer 44. The other end of the electrode 45 extends from the capacitor electrode 42 through an oxide film 47. The memory cell of the dynamic RAM is constituted by the capacitor electrode 42, transfer gate electrode 45, and the like. With such a structure, when α rays 48 enter the p-type element region 40 which constitute the memory cell, electrons are produced in the element region 40. However, because a thin oxide layer $35_3$ is interposed at the boundary surface between the element region 40 and the substrate 31, the transfer of the electrons produced at the side of the substrate 31 is obstructed by the oxide layer $35_3$. Due to this, most of the electrons are collected in the n⁻ diffusion layer 43 below the capacitor electrode 42, which causes a soft error such as an inversion or the like. Therefore, the C-MOS device shown in FIG. 14 has the drawback that it is extremely weak under α rays.

Figure 14:
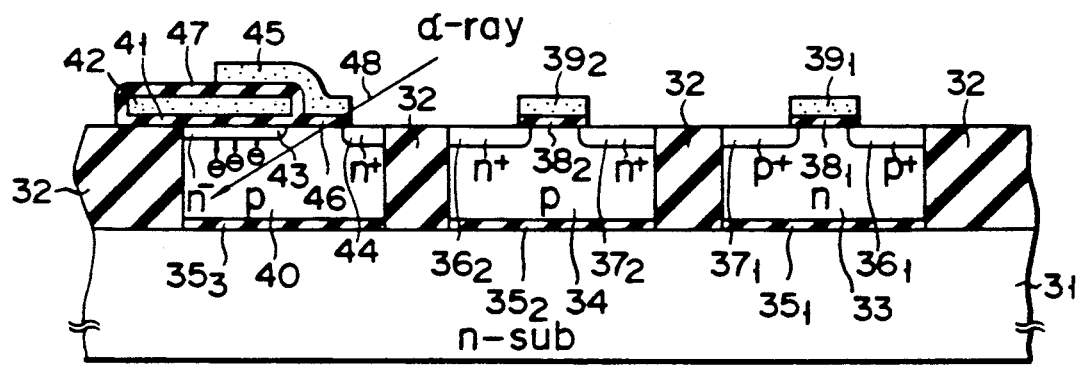
FIG. 14 is a cross-sectional view of the main part showing the dynamic RAM to which the C-MOS device of FIG. 13 was employed.
Figure 15:
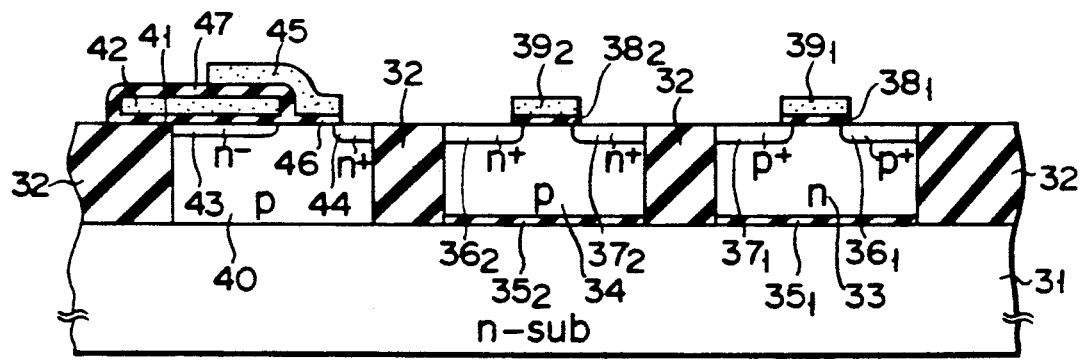
FIG. 15 is a cross-sectional view showing the dynamic memory to which the seventh embodiment of the present invention was employed.

It is therefore a subject of the seventh embodiment shown in FIG. 15 to solve the drawback which the C-MOS device of FIG. 14 as described above has.

The similar elements and parts as those shown in FIGS. 13 and 14 described before are designated by the same reference numerals and their descriptions will be omitted.

The dynamic memory to which the seventh embodiment of the present invention is applied is constructed in the manner such that, as shown in FIG. 15, the p-type element region 40 which constitutes the memory cell is formed to come into direct contact with the n-type silicon substrate 31, and that the thin oxide layers $35_1$ and $35_2$ are respectively provided on the boundary surfaces of the substrate 31 and of the n-type and p-type element regions 33 and 34, which constitute the p-channel and n-channel MOS transistors.

With such a structure, when α rays enter the p-type element region 40 in the memory cell section and when electrons are produced, since the p-type element region 40 is in direct contact with the n-type silicon substrate 31, the electrons produced are absorbed by the n-type silicon substrate 31 due to the potential difference at the pn junction thereof, thus suppressing a soft error. In addition, since the thin oxide layers $35_1$ and $35_2$ are interposed on the boundary surfaces among the silicon substrate 31, and among the n-type and p-type element regions 33 and 34 which form the p-channel and n-channel MOS transistors, the formation of the parasitic bipolar transistor is obstructed. Thus, it is possible to obtain a circumference circuit from a C-MOS device having good characteristics without the latch-up phenomenon.

Figure 16:
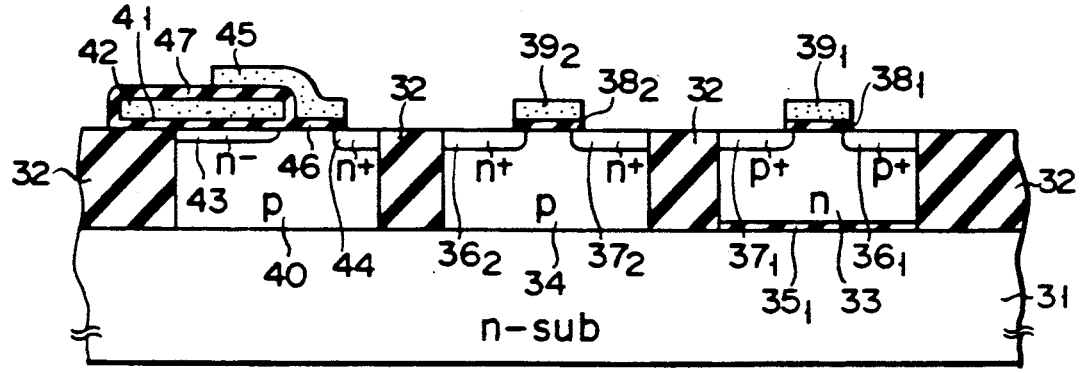
FIG. 16 is a cross-sectional view showing a modification of the seventh embodiment mentioned above.

Although the C-MOS device in the above seventh embodiment has the structure in which thin oxide films are interposed on both boundary surfaces among the silicon substrates and the n-type and p-type element regions constituting such a C-MOS device, it is not limited to this structure. For example, as shown in FIG. 16, it may also be constructed in the manner such that the thin oxide layer $35_1$ is interposed on only the boundary surface between the substrate 31 and the n-type element region 33 by which the p-channel MOS transistor is formed.

The C-MOS device of the present invention is not limited to the dynamic RAM as shown in the seventh embodiment, but it can also be similarly applied to other semiconductor memory devices such as a static RAM, EPROM, etc.

As described in detail above, according to the seventh embodiment of the present invention, it is possible to provide a semiconductor memory device with high performance and high reliability in which a soft error in the memory cell section due to α rays is suppressed and the latch-up phenomenon of a C-MOS device used as a circumference circuit is prevented.

What is claimed is:

1. A process for manufacturing a C-MOS device comprising the steps of:
   (a) forming on a planar semiconductor substrate with uniform doping of a first conductivity type an insulation film to be used as an element separating region;
   (b) selectively removing said insulating film by etching to form a plurality of element separating regions in an upright state on the substrate which in turn form a plurality of island regions of the substrate which are separated from one another on the substrate;
   (c) depositing by selective epitaxial growth thin monocrystalline semiconductor layers which are sufficiently thinner than said element separating regions at the bottom portion on said island regions of the substrate;
   (d) doping a first impurity of the first or second conductivity type into at least one of said thin semiconductor layers to form an impurity layer of the first or second conductivity type;
   (e) performing selective epitaxial growth to embed said island regions of the substrate with the monocrystalline semiconductor layers; and
   (f) doping a second impurity of the first or second conductivity type into at least one of said monocrystalline semiconductor layers to form element regions of the first and second conductivity types in the two adjacent island regions of the substrate having an impurity density lower than that of the impurity layer.

2. A process according to claim 1, wherein before performing said first selective epitaxial growth in step (c), a layer of the same conductivity type is formed on at least one of said island substrate regions, said layer having a higher density than that of the impurity layer which is formed on said island substrate region.

3. A process according to claim 1, wherein in step (d) of forming said impurity layer, said first impurity is doped to be the same conductivity type as that of said monocrystalline semiconductor layer in which said impurity layer is formed.

4. A process according to claim 1, wherein in step (d) of forming said impurity layer, said first impurity is doped to be the opposite conductivity type as that of said monocrystalline semiconductor layer in which said impurity layer is formed.

5. A process according to claim 1, wherein in step (f) of forming said element regions, said second impurity of the first or second conductivity type is doped in said monocrystalline semiconductor to be the opposite conductivity type as said impurity layer with respect to the monocrystalline semiconductor layer in which at least said impurity layer was formed.

6. A process for manufacturing a C-MOS device comprising the steps of:

(a) forming on a semiconductor substrate of a first conductivity type an insulation film to be used as element seperating regions;

(b) selectively removing said insulation film by etching to form element separating regions in an upright state on said substrate which in turn form a plurality of island regions of the substrate which are separated from one another on the substrate;

(c) forming an insulation layer which is sufficiently thinner than said element separating regions on selected regions among said plurality of island regions of the substrate separated by said element separating regions;

(d) forming a thin non-monocrystalline layer which is sufficiently thinner than said element separating regions on the whole surface;

(e) doping a first impurity of a first or second conductivity type in at least one of the thin non-monocrystalline semiconductor layers embedded in said island regions of the substrate to form an impurity layer having an impurity density of not smaller than $1 \times 10^{16}/cm^3$;

(f) forming a non-monocrystalline semiconductor layer on the whole surface so that said island regions of the substrate are embedded;

(g) radiating an energy beam onto said non-monocrystalline semiconductor layer and said impurity layer to convert them to a monocrystalline layer and to a monocrystalline impurity layer;

(h) removing said monocrystalline semiconductor layers on said element separating regions by etching; and (i) doping a second impurity of the first or second conductivity type into the island regions containing said first impurity in which said insulation layer is provided and into the monocrystalline semiconductor layer which remains in the island region of the substrate adjacent to said island region containing said first impurity to form element regions of the first and second conductivity types having an impurity density lower than that of the respective monocrystalline impurity layer in the two adjacent island regions.

7. A process for manufacturing a C-MOS device according to claim 1, wherein said impurity layer has an impurity density more than $1 \times 10^{16}/cm^3$.

* * * * *